US010914005B2

(12) United States Patent
Yahata

(10) Patent No.: US 10,914,005 B2
(45) Date of Patent: Feb. 9, 2021

(54) SUBSTRATE PROCESSING APPARATUS HAVING GAS GUIDE CAPABLE OF SUPPRESSING GAS DIFFUSION

(71) Applicant: KOKUSAI ELECTRIC CORPORATION, Tokyo (JP)

(72) Inventor: Takashi Yahata, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 8 days.

(21) Appl. No.: 16/141,563

(22) Filed: Sep. 25, 2018

(65) Prior Publication Data

US 2019/0032213 A1 Jan. 31, 2019

Related U.S. Application Data

(62) Division of application No. 15/444,878, filed on Feb. 28, 2017, now Pat. No. 10,184,177.

(30) Foreign Application Priority Data

Mar. 2, 2016 (JP) ................................ 2016-040011

(51) Int. Cl.
*C23C 16/455* (2006.01)
*C23C 16/44* (2006.01)
(Continued)

(52) U.S. Cl.
CPC .... *C23C 16/45544* (2013.01); *C23C 16/4412* (2013.01); *C23C 16/54* (2013.01);
(Continued)

(58) Field of Classification Search
CPC ............ C23C 16/455; H01L 21/67196; H01L 21/67201; H01L 21/67389; H01L 21/67754; H01L 21/67376
See application file for complete search history.

(56) References Cited

U.S. PATENT DOCUMENTS 5,433,780 A    7/1995   Ikeda et al.
5,981,399 A * 11/1999   Kawamura ....... H01L 21/67167
                                                                   438/715
(Continued)

FOREIGN PATENT DOCUMENTS

CN        101652851 A    2/2010
CN        101688303 A    3/2010
(Continued)

OTHER PUBLICATIONS

Korean Office Action dated Feb. 13, 2019 for the Korean Patent Application No. 10-2018-0155656.
(Continued)

*Primary Examiner* — Karl Kurple
(74) *Attorney, Agent, or Firm* — Volpe Koenig

(57) ABSTRACT

A technique that improves a quality of substrate processing. A substrate processing apparatus includes: a plurality of processing chambers and transfer chambers; a vacuum transfer chamber; a plurality of gate valves; a plurality of first gas supply units to supply an inert gas to a substrate; a transfer robot; and a control unit to control the plurality of first gas supply units and the transfer robot to: supply the inert gas to the substrate at a first flow rate when a distance between a gas supply port and the substrate passing through the plurality of gate valves is a first distance; and supply the inert gas to the substrate at a second flow rate greater than the first flow rate when the distance between the gas supply port and the substrate is a second distance greater than the first distance when the substrate passes through the plurality of gate valves.

15 Claims, 17 Drawing Sheets

(51) Int. Cl.
*H01L 21/673* (2006.01)
*H01L 21/67* (2006.01)
*C23C 16/54* (2006.01)
*H01L 21/677* (2006.01)

(52) U.S. Cl.
CPC .. *H01L 21/67167* (2013.01); *H01L 21/67196* (2013.01); *H01L 21/67201* (2013.01); *H01L 21/67376* (2013.01); *H01L 21/67389* (2013.01); *H01L 21/67742* (2013.01); *H01L 21/67748* (2013.01)

(56) References Cited

U.S. PATENT DOCUMENTS

| | | | |
|---|---|---|---|
| 6,530,993 B2 | 3/2003 | Hwang et al. | |
| 7,972,961 B2 * | 7/2011 | Sugiyama | H01J 37/32743 |
| | | | 118/719 |
| 8,794,896 B2 * | 8/2014 | Ashizawa | H01L 21/67739 |
| | | | 414/217 |
| 10,184,177 B2 * | 1/2019 | Yahata | H01L 21/67167 |
| 2007/0130738 A1 * | 6/2007 | Ashizawa | H01L 21/67739 |
| | | | 29/25.01 |
| 2008/0230096 A1 | 9/2008 | Kawamura et al. | |
| 2009/0060702 A1 | 3/2009 | Kobayashi et al. | |
| 2009/0114346 A1 | 5/2009 | Yashima et al. | |
| 2010/0022093 A1 | 1/2010 | Yamaguchi | |
| 2010/0093181 A1 | 4/2010 | Sugiyama et al. | |
| 2010/0236478 A1 | 9/2010 | Miyashita et al. | |
| 2011/0218659 A1 | 9/2011 | Nomura | |

FOREIGN PATENT DOCUMENTS

| | | |
|---|---|---|
| JP | 2003-007799 A | 1/2003 |
| JP | 2010-206222 A | 9/2010 |
| JP | 4584821 B | 11/2010 |
| JP | 2011-181771 A | 9/2011 |

OTHER PUBLICATIONS

Chinese Office Action dated Oct. 9, 2019 for the Chinese Patent Application No. 201710110698.6.

* cited by examiner

16# SUBSTRATE PROCESSING APPARATUS HAVING GAS GUIDE CAPABLE OF SUPPRESSING GAS DIFFUSION

CROSS-REFERENCE TO RELATED PATENT APPLICATION

This non-provisional U.S. patent application is a division of U.S. patent application Ser. No. 15/444,878 and claims priority under 35 U.S.C. § 119 of Japanese Patent Application No. 2016-040011, filed on Mar. 2, 2016, the entire contents of which are hereby incorporated by reference.

BACKGROUND

1. Field

The present disclosure relates to a substrate processing apparatus.

2. Description of the Related Art

The process of forming a film on a substrate by supplying a process gas and a reactive gas to the substrate is performed as one of the manufacturing processes of the semiconductor device.

Particles can be attached to the substrate during transport of the substrate. This can degrade the quality of substrate processing.

SUMMARY

Described herein is a technique that can improve the quality of substrate processing.

According to one aspect of the technique described herein, a substrate processing apparatus may include: at least two of processing chambers where a substrate is processed; a vacuum transfer chamber wherein the substrate is transferred; at least two gate valves comprising a first gate valve and a second gate valve and disposed between the vacuum transfer chamber and the at least two processing chambers, wherein the first gate valve is disposed between the vacuum transfer chamber and an exit of one of the at least two processing chambers and the second gate valve is disposed between the vacuum transfer chamber and an exit of another of the at least two processing chambers; a plurality of first gas supply units disposed at the vacuum transfer chamber and configured to supply an inert gas to the substrate when the substrate passes through one or more of the at least two gate valves, each of the plurality of first gas supply units comprising a first gas supply port extending parallel to the first gate valve and a second gas supply port extending parallel to the second gate valve; a transfer robot disposed in the vacuum transfer chamber and configured to transfer the substrate to the at least two gate valves; and a first gas guide installed between the first gas supply port and the second gas supply port, wherein the first gas guide protrudes toward the transfer robot farther than the first gas supply port and the second gas supply port.

DETAILED DESCRIPTION

First Embodiment

The first embodiment will be described with reference to the drawings.

The substrate processing system according to the first embodiment will be described below.

(1) The Configuration of the Substrate Processing System

Figure 1:
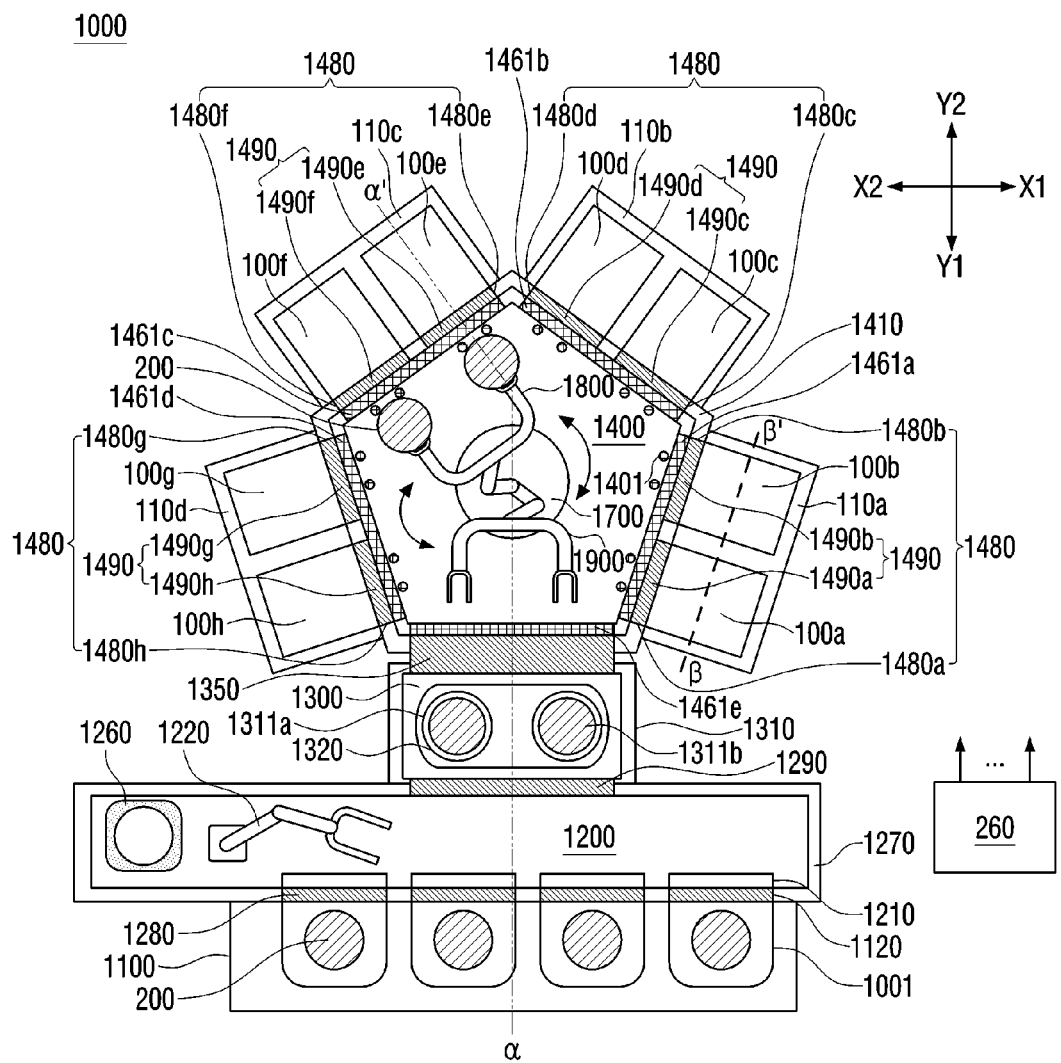
FIG. 1 schematically illustrates a horizontal cross-section of a substrate processing system according to an embodiment described herein.
Figure 2:
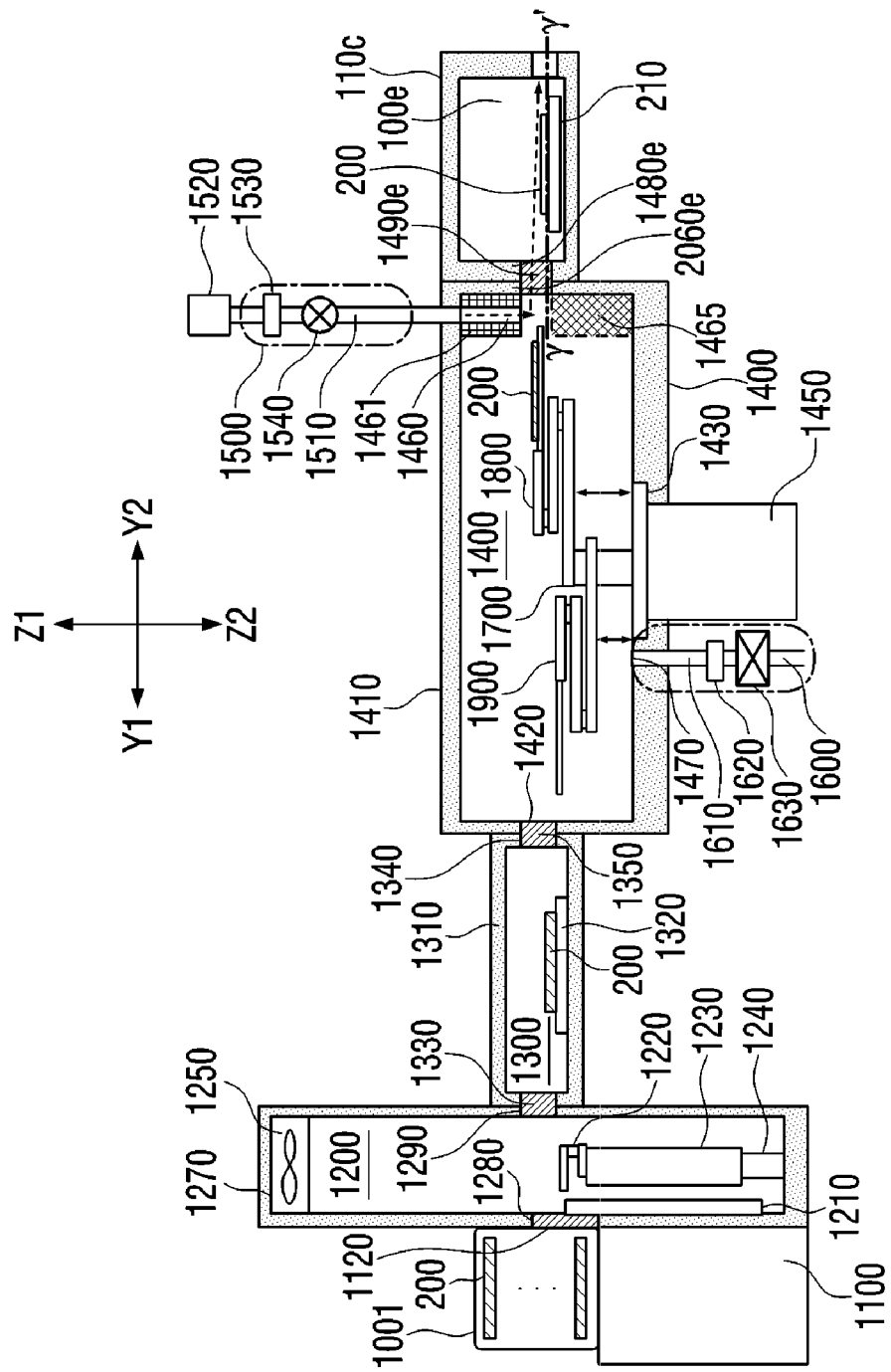
FIG. 2 schematically illustrates a vertical cross-section of a substrate processing system according to the first embodiment.
Figure 3:
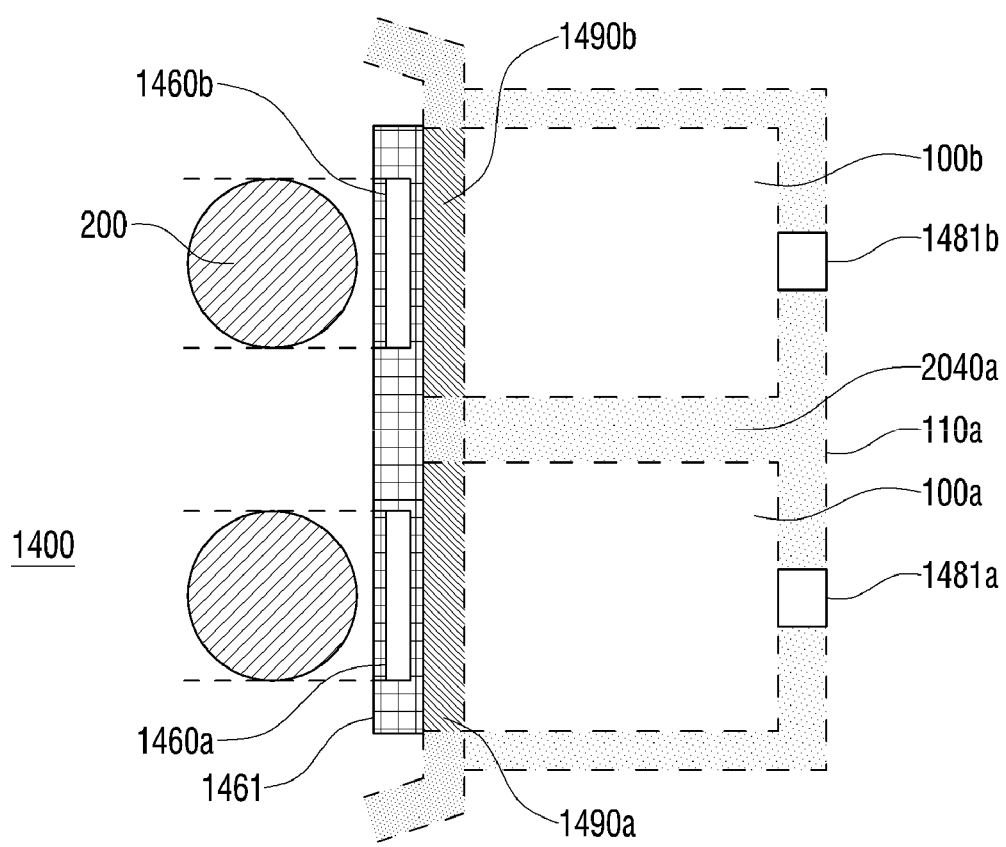
FIG. 3 schematically illustrates the configuration around the processing module in the vacuum transfer chamber of the substrate processing system according to the first embodiment.
Figure 4:
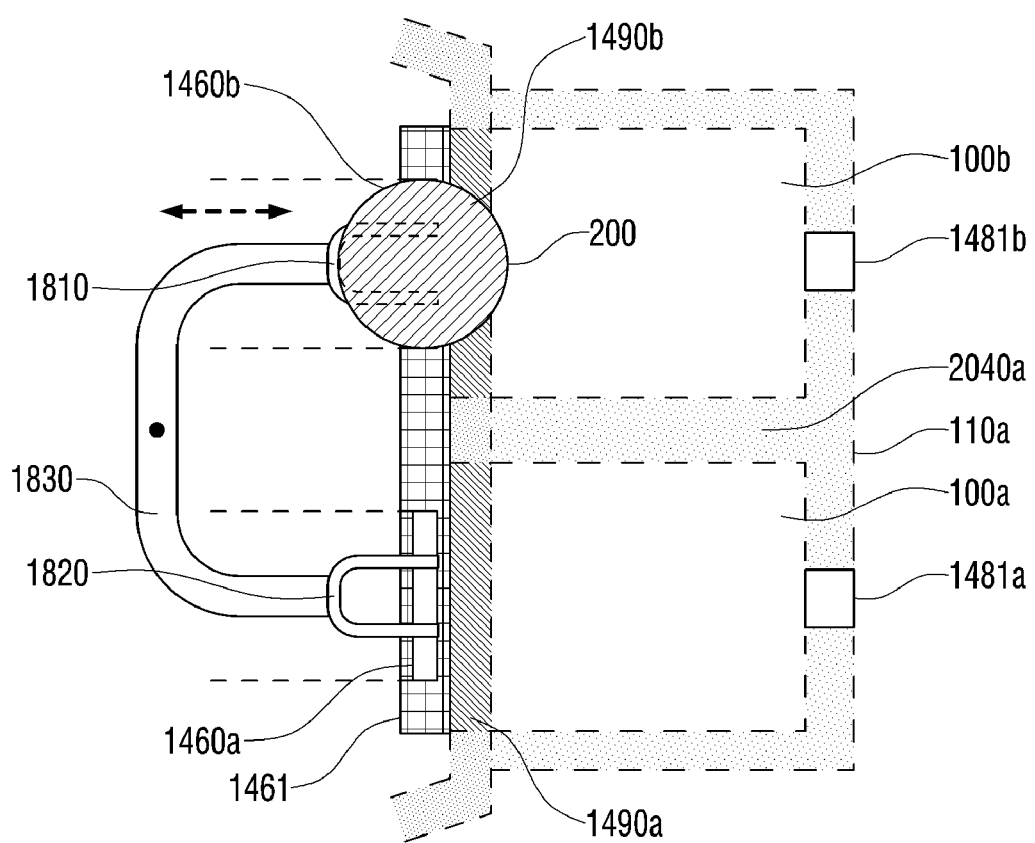
FIG. 4 schematically illustrates the configuration around the processing module in the vacuum transfer chamber of the substrate processing system without wafers placed on one end effectors according to the first embodiment.
Figure 5:
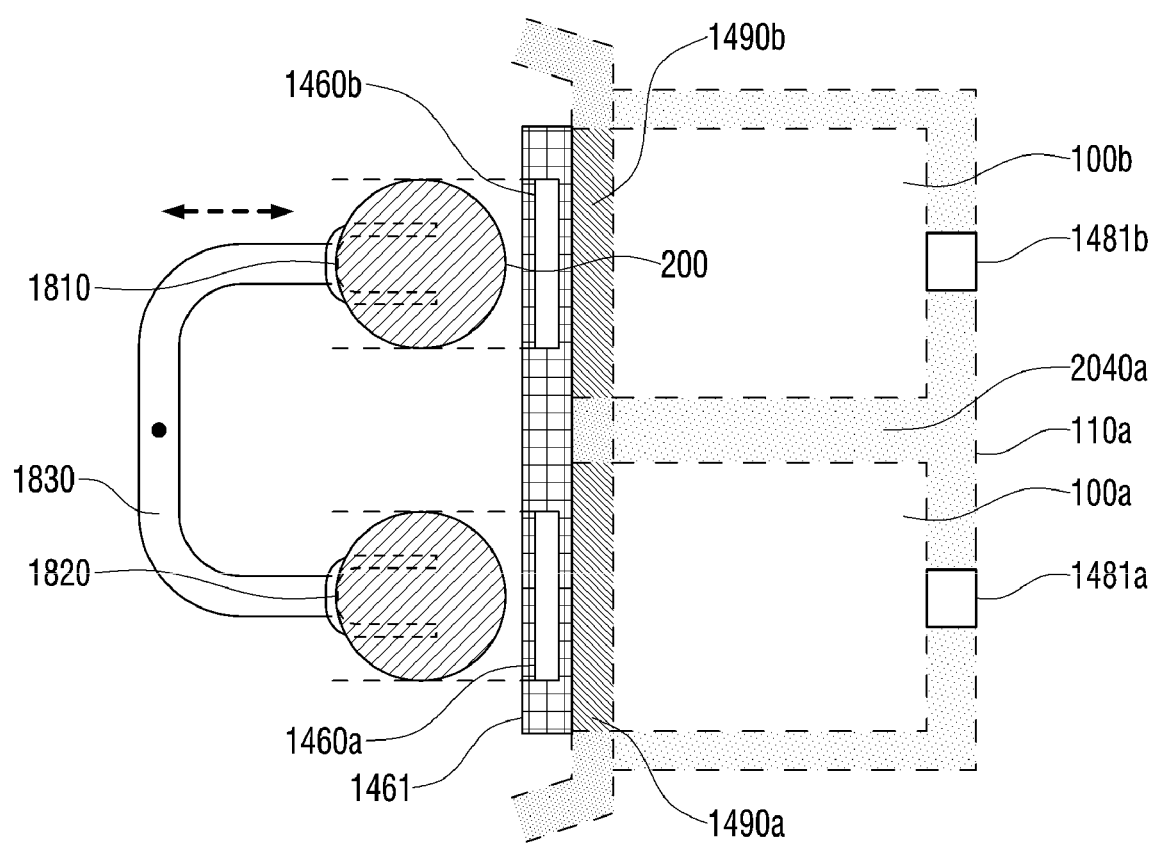
FIG. 5 illustrates the configuration of the processing module in the vacuum transfer chamber of the substrate processing system according to the first embodiment, before and after wafer transfer.
Figure 6:
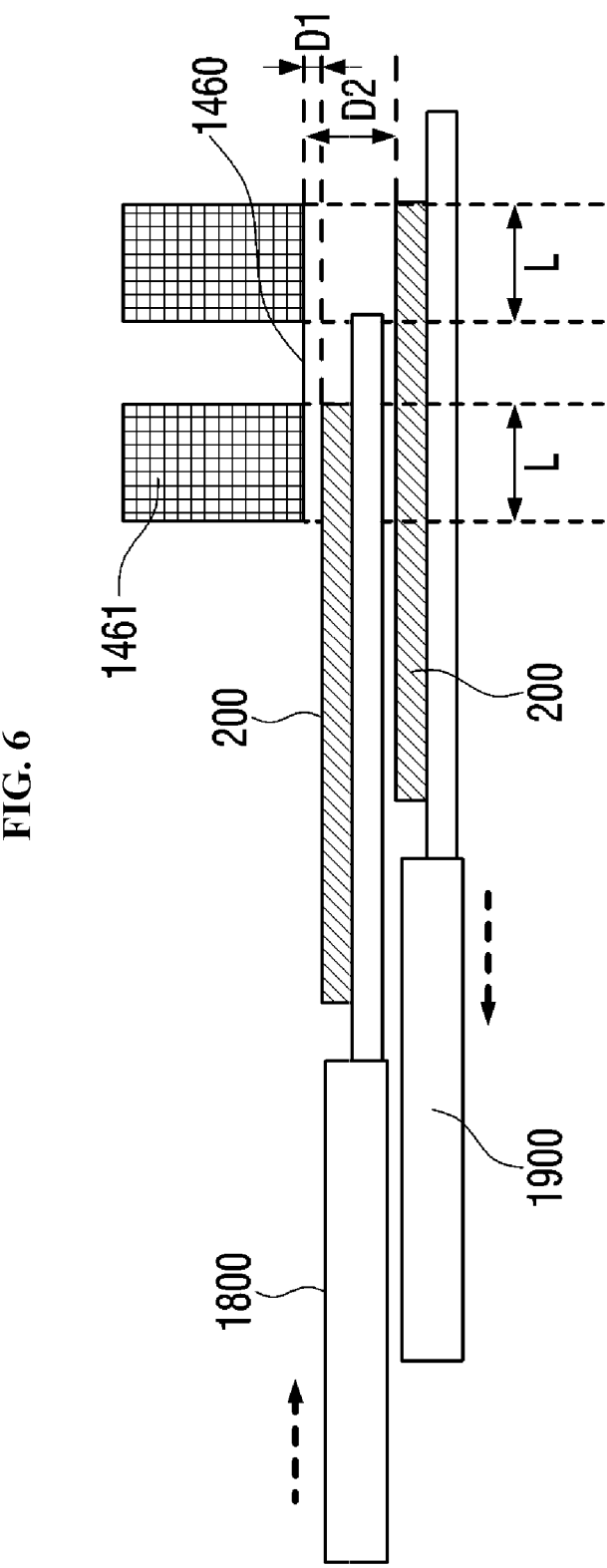
FIG. 6 illustrates the relationship between the positions of a first gas supply unit and wafer in the substrate processing system according to the first embodiment.
Figure 7:
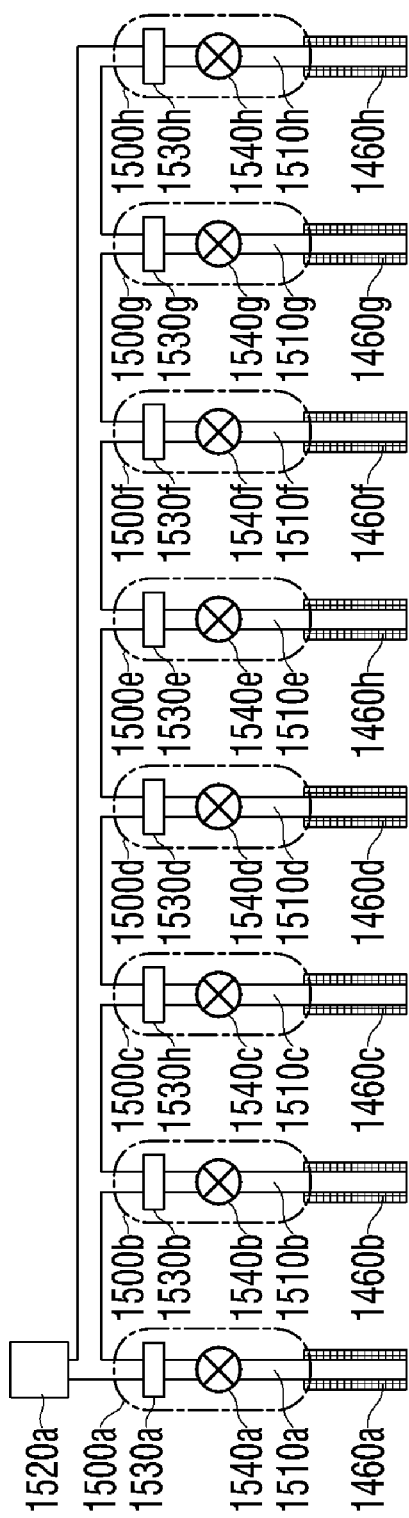
FIG. 7 schematically illustrates the configuration of the first gas supply unit of the substrate processing system according to the first embodiment.
Figure 8:
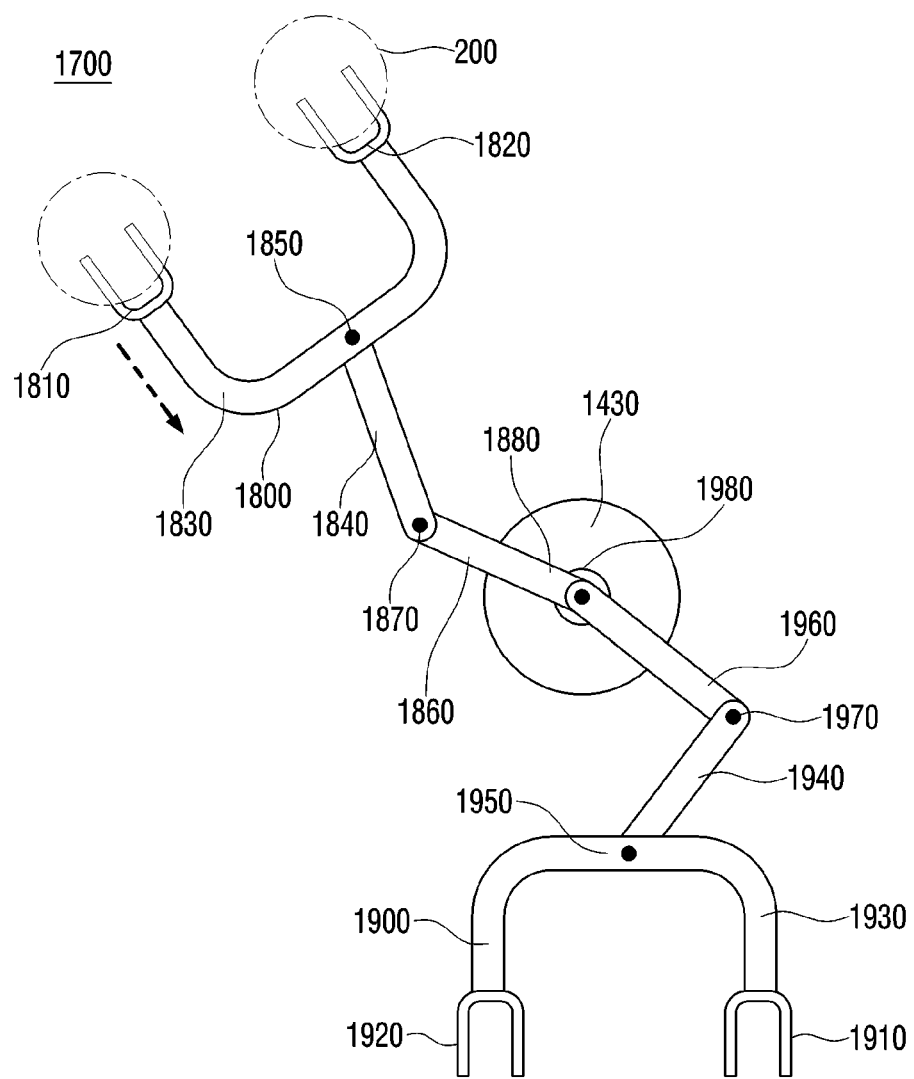
FIG. 8 schematically illustrates the configuration of a vacuum transfer robot in the substrate processing system according to the first embodiment.
Figure 9:
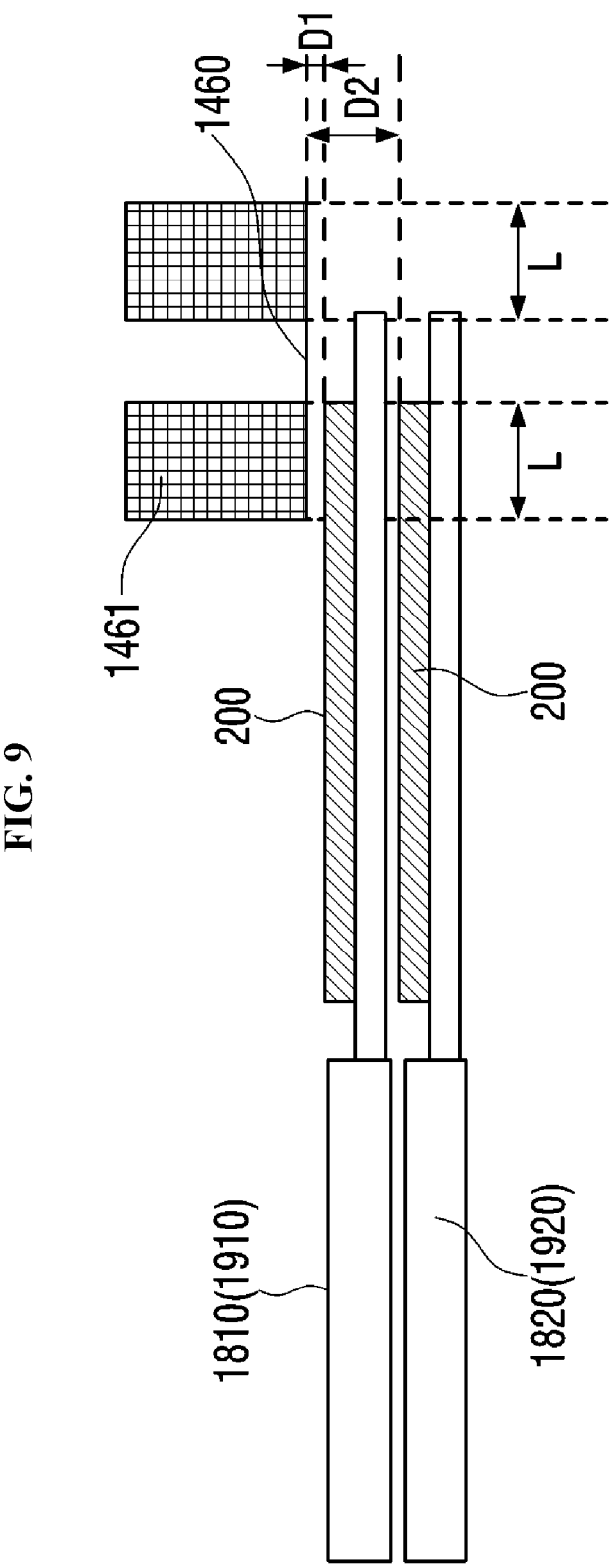
FIG. 9 illustrates the relationship between heights of end effectors of the vacuum transfer robot of the substrate processing system according to the first embodiment.
Figure 10:
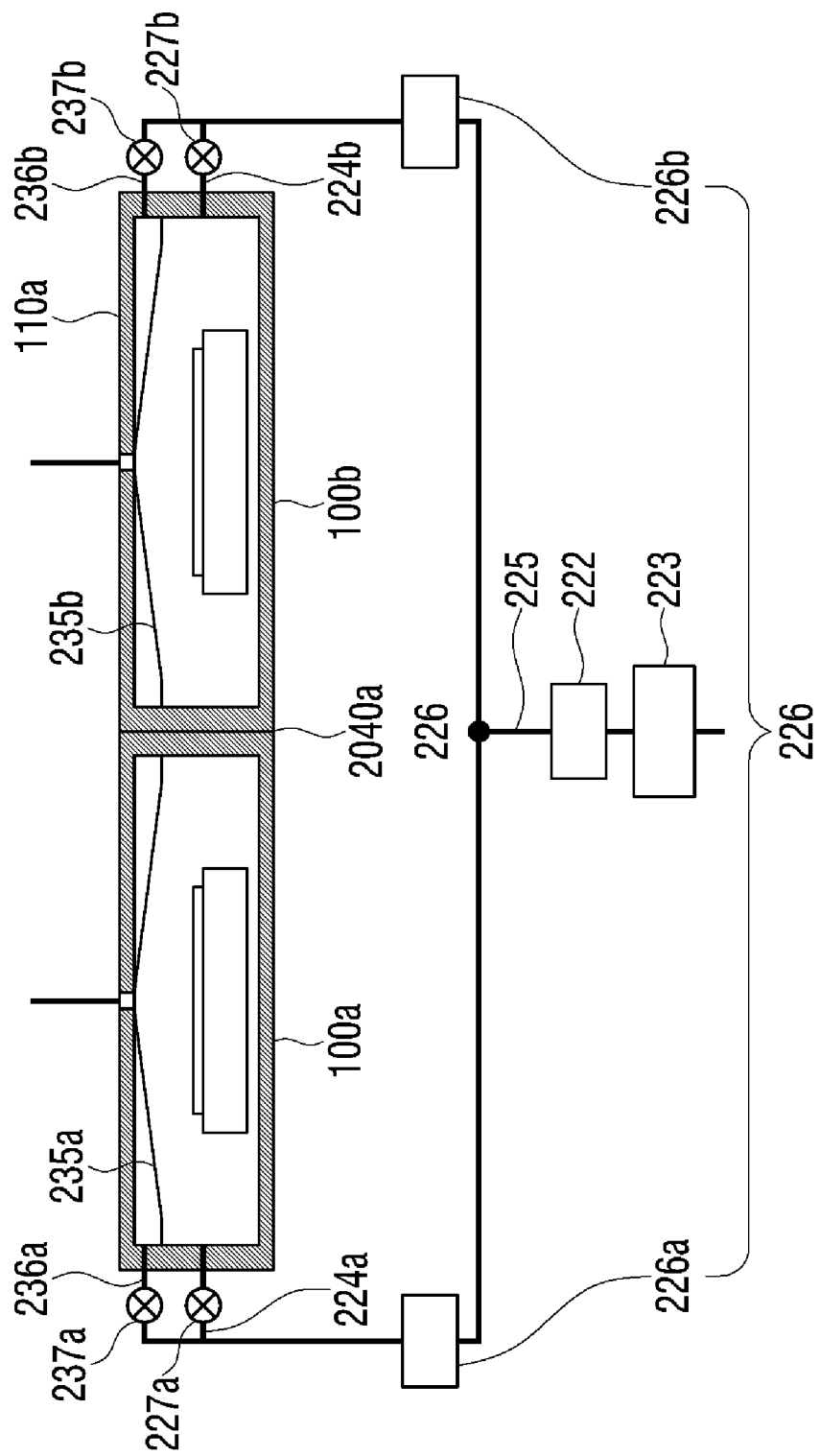
FIG. 10 schematically illustrates the configuration of a substrate processing apparatus according to the first embodiment.
Figure 11:
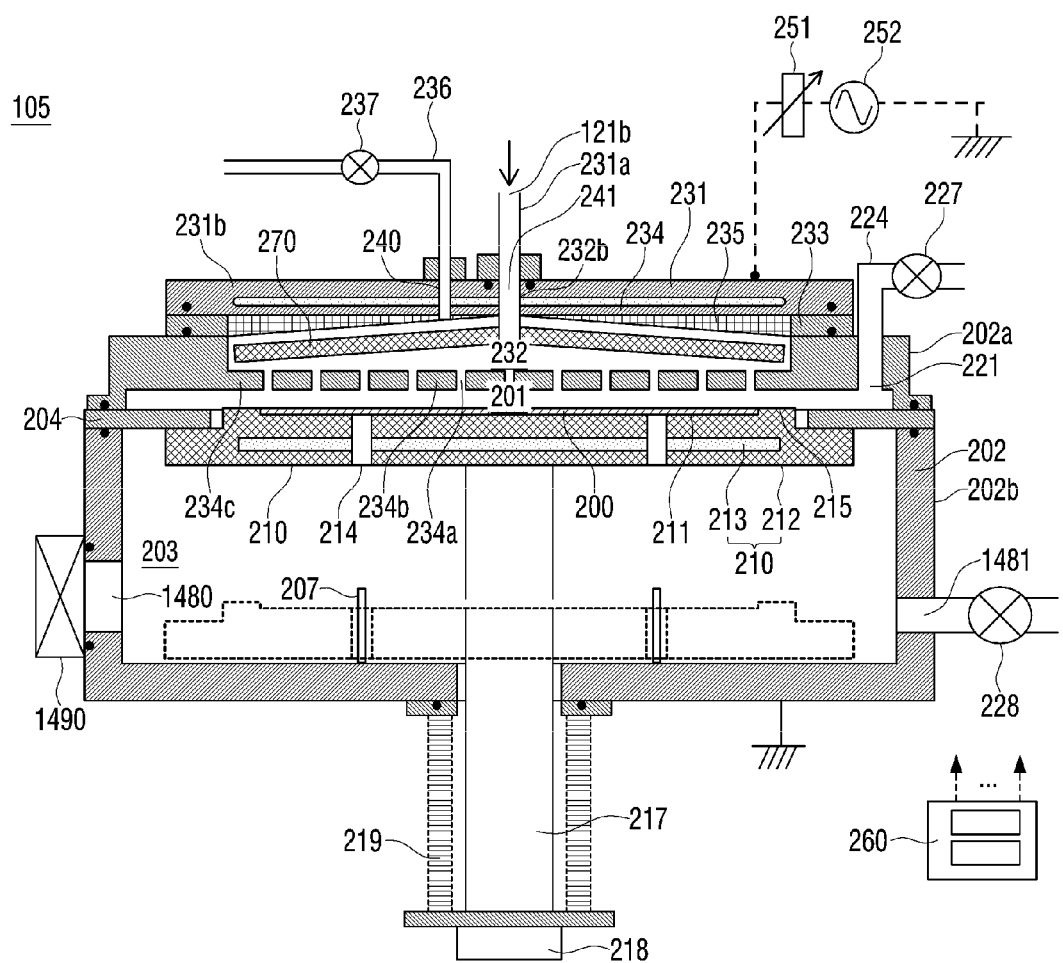
FIG. 11 schematically illustrates a vertical cross-section of a chamber of a substrate processing apparatus according to the first embodiment.

The configuration of the substrate processing system according to the first embodiment will be described with reference to FIG. 1 through FIG. 11. FIG. 1 illustrates the horizontal cross-section of the substrate processing system according to the first embodiment. FIG. 2 illustrates a vertical cross-section of the substrate processing system according to the first embodiment shown in FIG. 1 taken along the line α-α'. FIG. 3 illustrates the cross-section taken along the γ-γ' line in FIG. 2 seen from the Z1 direction. For the purpose of description, components such as a vacuum transfer robot 1700 are not shown in FIG. 3. FIG. 6 illustrates the relationship between the positions of the first gas supply unit 1500 and the wafer 200 of the substrate processing system according to the first embodiment. FIG. 7 illustrates an inert gas supply system configured to supply an inert gas into a transfer chamber of the substrate processing system according to the first embodiment. FIG. 8 illustrates the detailed configuration of an arm shown in FIG. 1. FIG. 10 illustrates a vertical cross-section taken along the line β-β' of a gas supply system configured to supply a gas into the processing module of FIG. 1. FIG. 11 illustrates a chamber provided in the processing module of the substrate processing system according to the first embodiment.

Referring to FIG. 1 and FIG. 2, a substrate processing system 1000 according to the first embodiment processes a wafer 200. The substrate processing system 1000 includes an IO stage 1100, an atmospheric transfer chamber 1200, a loadlock chamber 1300, a vacuum transfer chamber 1400 and processing modules 110a through 110d. Next, the configurations of the substrate processing system 1000 will be described in detail. In FIG. 1, the X1 represents the right direction, the X2 represents the left direction, the Y1 represents the front direction, and the Y2 represents the rear direction.

<Atmospheric Transfer Chamber and IO Stage>

The IO stage 1100 (loading port shelf) is installed at the front side of the substrate processing system 1000. A plurality of pods 1001 are mounted on the IO stage 1100. The pod 1001 is used as a carrier to transport the substrate 200 such as a silicon (Si) substrate. A plurality of unprocessed substrates (wafers) 200 or a plurality of processed substrates 200 are horizontally stored in the pod 1001.

A cap 1120 is installed at the pod 1001. The cap 1120 is opened/closed by a pod opener 1210 described later. The pod opener 1210 opens and closes the cap 1120 of the pod 1001 placed in the IO stage 1100. When the pod opener 1210 opens the substrate loading/unloading port 1280, the substrate 200 may be loaded into or unloaded from the pod 1001. The pod 1001 is provided to or discharged from the IO stage 1100 by an in-process conveyance device (not shown) (Rail Guided Vehicle (RGV)).

The IO stage 1100 is installed adjacent to the atmospheric transfer chamber 1200. The loadlock chamber 1300, which will be described later, is connected to a side of the atmospheric transfer chamber 1200 other than a side to which the IO stage 1100 is connected.

An atmospheric transfer robot 1220, which is a first transfer robot carrying the substrate 200, is installed in the atmospheric transfer chamber 1200. As shown in FIG. 2, the atmospheric transfer robot 1220 is elevated by an elevator 1230 installed in the atmospheric transfer chamber 1200 and is reciprocated laterally by a linear actuator 1240.

As shown in FIG. 2, a cleaning unit 1250 for supplying clean air is installed above the atmospheric transfer chamber 1200. As shown in FIG. 1, a device (hereinafter referred to as a pre-aligner) 1260 configured to align a notch in the substrate 200 or orientation flat is provided on the left side of the atmospheric transfer chamber 1200.

As shown in FIG. 1 and FIG. 2, the substrate loading/unloading port 1280 and the pod opener 1210 are installed at the front side of a housing 1270 of the atmospheric transfer chamber 1200. The substrate 200 is loaded into or unloaded from the atmospheric transfer chamber 1200 via the substrate loading/unloading port 1280. The IO stage 1100 is installed at the pod opener 1210 with the substrate loading/unloading port 1280 interposed therebetween. That is, the IO stage 1100 is installed outside the housing 1270.

A substrate loading/unloading port 1290 is installed at the rear side of the housing 1270 of the atmospheric transfer chamber 1200. The wafer 200 is carried into or out of the loadlock chamber 1300 via the substrate loading/unloading port 1290. The substrate loading/unloading port 1290 is opened or closed by a gate valve 1330, which will be described later. When the substrate loading/unloading port 1290 is opened, the wafer 200 may be loaded into the load lock chamber 1300 or unloaded from the load lock chamber 1300.

<Loadlock Chamber>

The loadlock chamber 1300 is installed adjacent to the atmospheric transfer chamber 1200. The vacuum transfer chamber 1400 is provided on a side of a housing 1310 constituting the loadlock chamber 1300 other than the sides of the housing 1310 which are in contact with the atmospheric transfer chamber 1200. Since an inner pressure of the housing 1310 is adjusted to an inner pressure of the atmospheric transfer chamber 1200 or an inner pressure of the vacuum transfer chamber 1400, the load lock chamber 1300 is constructed to withstand a negative pressure.

A substrate loading/unloading port 1340 is at a side of the housing 1310 which is in contact with the vacuum transfer chamber 1400. The substrate loading/unloading port 1340 is opened or closed by a gate valve 1350. The wafer 200 is loaded into or unloaded from the vacuum transfer chamber 1400 through the substrate loading/unloading port 1340.

A substrate support 1320 having at least two placing surfaces 1311a and 1311b is installed in the loadlock chamber 1300. The wafers 200 are placed on the at least two placing surfaces 1311a and 1311b. The distance between the substrate placing surfaces 1311a and 1311b is set according to the distance between the fingers of the vacuum transfer robot 1700 described later.

<Vacuum Transfer Chamber>

The substrate processing system 1000 includes the vacuum transfer chamber (transfer module) 1400, which is a transfer space where the substrate 200 is transported under negative pressure. The shape of a housing 1410 defining the vacuum transfer chamber 1400 is pentagonal when viewed from above. The loadlock chamber 1300 and the processing modules 110a through 110d where the wafers 200 are processed are connected to the respective sides of the pentagonal housing 1410. The vacuum transfer robot 1700, which is a second transfer robot for transferring the substrate 200 under negative pressure, is installed at the approximate center of the vacuum transfer chamber 1400 with the flange 1430 as a base. While pentagonal vacuum transfer chamber 1400 is shown in FIG. 1, vacuum transfer chamber 1400 may be polygonal such as rectangular and hexagonal.

A substrate loading/unloading port 1420 is installed in a sidewall of the housing 1410 adjacent to the loadlock chamber 1300. The substrate loading/unloading port 1420 is opened or closed by the gate valve 1350. The wafer 200 is loaded into or unloaded from the vacuum transfer chamber 1400 through the substrate loading/unloading port 1420.

As shown in FIG. 2, the vacuum transfer robot 1700, which is a transfer robot installed in the vacuum transfer chamber 1400, may be lifted and lowered by an elevator 1450 while maintaining the vacuum transfer chamber airtight by a flange 1430. The detailed configuration of the vacuum transfer robot 1700 will be described later. The elevator 1450 can lift two arms 1800 and 1900 of the vacuum transfer robot 1700 independently.

As shown in FIG. 1, the processing modules 110a, 110b, 110c and 110d where a desired processing is performed on the wafer 200 are connected to sidewalls of the housing 1410 other than the sidewall to which the loadlock chamber 1300 is connected.

A plurality of chambers of the substrate processing apparatus are provided in each of the processing modules 110a, 110b, 110c and 110d. Specifically, the chambers 100a and 100b are provided in the processing module 110a. The chambers 100c and 100d are provided in the processing module 110b. The chambers 100e and 100f are provided in the processing module 110c. The chambers 100g and 100h are provided in the processing module 110d. Hereinafter, one of the chambers 100a through 100h may be referred to as "chamber 100" or all of the chambers 100a through 100h may be collectively referred to as "chamber 100".

Of the sidewalls of the housing 1410, substrate loading/unloading ports 1480a through 1480h are installed in the sidewalls facing each chamber 100. For example, the substrate loading/unloading port 1480e is installed in the sidewall facing the chamber 100e. Hereinafter, one of the substrate loading/unloading ports 1480a through 1480h may be referred to as "substrate loading/unloading port 1480" or all of the substrate loading/unloading ports 1480a through 1480h may be collectively referred to as "substrate loading/unloading port 1480".

Similar to the substrate loading/unloading port 1480e and the chamber 100e shown in FIG. 2, the substrate loading/unloading port 1480a of FIG. 1 is installed in the sidewall facing the chamber 100a.

Similar to the substrate loading/unloading port 1480f and the chamber 100f shown in FIG. 2, the substrate loading/unloading port 1480b of FIG. 1 is installed in the sidewall facing the chamber 100b.

As shown in FIG. 1, gate valves (GV) 1490a through 1490h are installed in chambers 100a through 100h. Specifically, the gate valve 1490a is provided between the chamber 100a and the vacuum transfer chamber 1400. The gate valve 1490b is provided between the chamber 100b and the vacuum transfer chamber 1400. The gate valve 1490c is provided between the chamber 100c and the vacuum transfer chamber 1400. The gate valve 1490d is provided between the chamber 100d and the vacuum transfer chamber 1400. The gate valve 1490e is provided between the chamber 100e and the vacuum transfer chamber 1400. The gate valve 1490f is provided between the chamber 100f and the vacuum transfer chamber 1400. The gate valve 1490g is provided between the chamber 100g and the vacuum transfer chamber 1400. The gate valve 1490h is provided between the chamber 100h and the vacuum transfer chamber 1400. Hereinafter, one of the gate valves 1490a through 1490h may be referred to as "gate valve 1490" or all of the gate valves 1490a through 1490h may be collectively referred to as "gate valve 1490".

Each gate valve 1490 opens or closes the substrate loading/unloading port 1480. The wafer 200 is carried into or out of the chamber 100 through the substrate loading/unloading port 1480.

Figure 16:
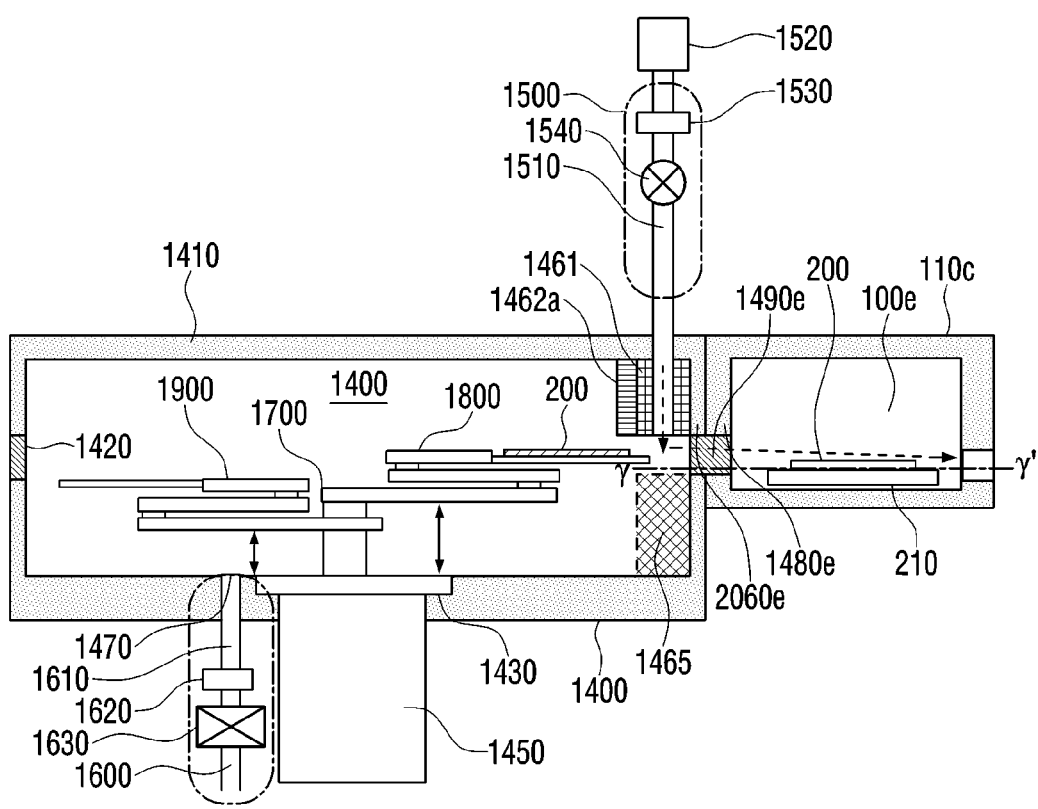
FIG. 16 schematically illustrates a vertical cross-section of a substrate processing system according to other embodiments described herein.

The inventors of the present application have confirmed that the following problems are posed by the configuration of the substrate processing system. As shown in FIG. 16, the chambers 100a through 100h are provided in the processing modules 110a through 110d. The gate valves 1490a through 1490h are provided between the chambers 100a through 100h and the vacuum transfer chamber 1400. FIG. 3 illustrates the configuration of the processing module 110a. In the example shown in FIG. 3, when the wafer 200 is loaded into the chambers 100a and 100b, the pressure of the chamber 100a may be different from the pressure of the chamber 100b. When there is a difference between the pressure of the vacuum transfer chamber 1400 and the pressure of the chamber 100a or the pressure of the chamber 100b, the inner atmosphere of at least one of the chambers 100a and 100b may flow into the vacuum transfer chamber 1400. The inner atmosphere of the chamber 100a may be discharged from the chamber 100a into the chamber 100b or the inner atmosphere of the chamber 100b may be discharged from the chamber 100b into the chamber 100a. As a result of an intensive study by the inventors of the present application, it has been found that when a gas (e.g. an inert gas) is supplied along the direction indicated by the dashed line arrow in FIG. 2, the inner atmospheres of the chambers 100a and 100b may be prevented from flowing into the vacuum transfer chamber 1400. Hereinafter, a configuration for supplying inert gas will be described.

<First Gas Supply Unit>

As shown in FIG. 1, FIG. 3, FIG. 4 and FIG. 6, a gas supply port 1460 (also referred to as first gas supply port, inert gas supply port or gate valve gas supply port) is provided on the ceiling of the housing 1410 near the gate valve 1490a. A first gas guide 1461 is installed around the first gas supply port 1460. The gas guide 1461 prevents the inert gas supplied through the first gas supply port 1460 from diffusing upward in the vacuum transfer chamber 1400. The gas guide 1461 protrudes from the first gas supply unit 1500 toward the vacuum transfer robot 1700. In the first embodiment, FIG. 3 shows the substrate processing system shown in FIG. 2 seen from the Z1 direction along the γ-γ' line. For purpose of description, the same structure as the vacuum transfer robot 1700 is now shown in FIG. 3. FIG. 6 shows the relationship between the position of the first gas supply unit 1500 and the position of the wafer 200. Hereinafter, one of the first gas supply units 1500a, 1500b, 1500c, 1500d, 1500e, 1500f, 1500g and 1500h is shown in FIGS. 1500c, 1500d, 1500e, 1500f, 1500g and 1500h may be collectively referred to as gas supply unit 1500. For example, the first gas supply unit 1500e may be referred to as gas supply unit 1500.

An inert gas supply pipe 1510 is connected to the first gas supply port 1460. An inert gas source 1520, a mass flow controller 1530 and a valve 1540 are sequentially installed at the inert gas supply pipe 1510 from the upstream side to the downstream side of the inert gas supply pipe 1510. Components such as the mass flow controller 1530 and the valve 1540 controls the amount of inert gas supplied to the vicinity of the gate valve 1490 in the housing 1410 or to the surface of the wafer 200 passing through the gate valve 1490. Preferably, the height of the lower end of the first gas supply port 1460 is the same as the height of the upper end of the gate valve 1490. With this arrangement, the inert gas supplied through the first gas supply port 1460 flows into the gate valve 1490 or the chamber 100.

An inert gas supply unit 1500 includes a first gas supply port 1460, the inert gas supply pipe 1510, the mass flow controller 1530 and the valve 1540. The inert gas supply unit 1500 is configured to supply inert gas to the gate valve 1490 of the vacuum transfer chamber 1400. The inert gas supply unit 1500 may further include the inert gas source 1520.

As shown in FIG. 6, the distance $D_1$ between the lower end of the first gas supply port 1460 and the surface of the wafer 200 and the thickness L of the gas guide 1461 satisfy $D_1 < L$. The inert gas supplied through the first gas supply port 1460 can be directly supplied to the wafer 200. Accordingly, any one or more of process gas, reactive gas, by-products, and particles attached to the surface of the wafers 200 may be desorbed and prevented from entering the vacuum transfer chamber 1400. On the other hand, if $D_1$>L, the gas supplied through the first gas supply port 1460 can be directly diffused into the vacuum transfer chamber 1400 without being supplied to the wafer 200. When the gas is directly diffused into the vacuum transfer chamber 1400, the effect of desorbing materials such as the gas adsorbed on the wafer 200 is reduced. The similar may be applied to the distance $D_2$ between the wafer 200 supported by the lower arm 1900. That is, $D_2$<L may be satisfied. As shown in FIG. 6, when the two arms including the upper arm 1800 and the lower arm 1900 are provided at different heights, the wafer 200 may be loaded and unloaded simultaneously, thereby improving the throughput.

Preferably, the flow rates of the inert gas supplied to the wafers 200 supported by the two arms may be different. When the distance $D_1$ between the wafer 200 supported by the upper arm 1800 and the first gas supply port 1460 differs from the distance $D_2$ between the wafer 200 and the first gas supply port 1460 supported by the lower arm 1900 and the amount of the inert gas supplied to the wafer 200 supported by the lower arm 1900 is the same as the amount of the inert gas supplied to the wafer 200 supported by the upper arm 1800, the inner atmosphere of the chamber 100 may be introduced into the vacuum transfer chamber 1400. When the amount of the inert gas supplied to the wafer 200 supported by the lower arm 1900 is greater than the amount of the inert gas supplied to the wafer 200 supported by the upper arm 1800, the inner atmosphere of the chamber 100 may be prevented from being introduced into the vacuum transfer chamber 1400.

A first gas supply unit 1500, i.e. the first gas supply units 1500*a*, 1500*b*, 1500*c*, 1500*d*, 1500*e*, 1500*f*, 1500*g* and 1500*h* configured to supply an inert gas to the wafers 200 passing through the gate valves 1490*a*, 1490*b*, 1490*c*, 1490*d*, 1490*e*, 1490*f*, 1490*g* and 1490*h* shown in FIG. 1 and FIG. 2 are identical to those shown in FIG. 7. As shown in FIG. 7, the first gas supply units 1500*a*, 1500*b*, 1500*c*, 1500*d*, 1500*e*, 1500*f*, 1500*g* and 1500*h* may share the inert gas source 1520.

By controlling mass flow controllers 1530*b*, 1530*c*, 1530*d*, 1530*e*, 1530*f*, 1530*g* and 1530*h* installed in the first gas supply units 1500*a*, 1500*b*, 1500*c*, 1500*d*, 1500*e*, 1500*f*, 1500*g* and 1500*h*, respectively, the amount of the inert gas supplied to the surface of the wafers 200 passing through the valves 1490*a*, 1490*b*, 1490*c*, 1490*d*, 1490*e*, 1490*f*, 1490*g* and 1490*h* can be adjusted independently. The opening and closing timings of the valves 1540*a*, 1540*b*, 1540*c*, 1540*d*, 1540*e*, 1540*f*, 1540*g* and 1540*h* provided in the first gas supply units 1500*a*, 1500*b*, 1500*c*, 1500*d*, 1500*e*, 1500*f*, 1500*g* and 1500*h* may differ from one another. The supply timing and the amount of the inert gas may be varied according to the timings such as the opening and closing timings of the gate valves 1490*a*, 1490*b*, 1490*c*, 1490*d*, 1490*e*, 1490*f*, 1490*g* and 1490*h*, the timing of transporting the wafer 200 by the vacuum transfer robot 1700 and the timing of placing the wafer on the lift pins 207.

The inner pressure of the chamber 100 may be adjusted to be lower than the inner pressure of the vacuum transfer chamber 1400 so as to prevent the inner atmosphere of the chamber 100 from being introduced into the vacuum transfer chamber 1400. Referring to FIG. 3, when the gate valve 1490*a* and the gate valve 1490*b* between the processing module 110*a* and the vacuum transfer chamber 1400 are simultaneously opened, the inner atmosphere of the vacuum transfer chamber 1400 may be introduced into both of the chambers 100*a* and 100*b*. As a result, the difference between the pressure of the vacuum transfer chamber 1400 and the pressures of the chamber 100*a* and the chamber 100*b* may be reduced. In this case, by-products or particles present in the gas or in the chambers 100*a* and 100*b* may be introduced into the vacuum transfer chamber 1400.

A gas guide (second gas guide) 1465 may be installed to face the first gas supply port 1460 of each first gas supply unit 1500 in the vacuum transfer chamber 1400. Referring to FIG. 2, the upper end of the gas guide 1465 and the height of the lower end of the opening of the gate valve 1490*e* may be at the same height. By installing the gas guide 1465, the inert gas supplied through the first gas supply port 1460 may be supplied into the chamber rather than diffusing into the vacuum transfer chamber 1400 even when the first gas supply port 1460 and the wafer 200 are not facing each other. The case where the first gas supply port 1460 and the wafer 200 are not facing is shown in FIG. 4 and FIG. 5. First, as shown in FIG. 4, at least one of end effectors not supporting the wafer 200 is inserted into the chamber 100. Second, as shown in FIG. 5, the end effectors both supporting the wafers 200 starts to be introduced into the chamber, and the unloading is completed.

An exhaust port 1470 for exhausting the inner atmosphere of the housing 1410 is installed at the bottom of the housing 1410. An exhaust pipe 1610 is installed in the exhaust port 1470. An automatic pressure controller (APC) 1620 and a pump 1630 are installed at the exhaust pipe 1610 from the upstream side to the downstream side of the exhaust pipe 1610. The APC 1620 includes at least one valve body (not shown). The valve body can be controlled based on the instruction transmitted from a control unit 260. When a control device (not shown) is installed in the APC 1620, the opening degree of the valve body included in the APC 1620 may be directly controlled by the control device of the APC 1620.

A transfer chamber exhaust unit 1600 of the vacuum transfer chamber 1400 includes the exhaust port 1470, the exhaust pipe 1610 and the APC 1620. The transfer chamber exhaust unit (gas exhaust unit) 1600 may further include the pump 1630.

Preferably, the exhaust port 1470 is spaced apart from the gate valves 1490*a*, 1490*b*, 1490*c*, 1490*d*, 1490*e*, 1490*f*, 1490*g* and 1490*h*. That is, the exhaust port 1470 is installed in the vicinity of the vacuum transfer robot 1700. Accordingly, the inert gas supplied by the first gas supply unit 1500 or the inner atmosphere of the chamber 100 can be prevented from flowing into the transfer chamber 1400.

The inner atmosphere of the vacuum transfer chamber 1400 is co-controlled by the first gas supply unit 1500 and the gas exhaust unit 1600 while the gate valves 1490*a*, 1490*b*, 1490*c*, 1490*d*, 1490*e*, 1490*f*, 1490*g* and 1490*h* are closed. When any one of the gate valves 1490*a*, 1490*b*, 1490*c*, 1490*d*, 1490*e*, 1490*f*, 1490*g* and 1490*h* is open or the gate valves 1490*a*, 1490*b*, 1490*c*, 1490*d*, 1490*e*, 1490*f*, 1490*g* are all closed, the opening degree of the valve body of the APC 1620 is adjusted such that the inert gas flows in the direction indicated by the dashed line arrow in FIG. 2. Alternately, the valve body of APC 1620 may be completely closed.

Next, the vacuum transfer robot 1700 mounted in the vacuum transfer chamber 1400 will be described with reference to FIG. 8. FIG. 8 is an enlarged view of the vacuum transfer robot 1700 of FIG. 1.

The vacuum transfer robot 1700 has two arms, the arm 1800 and the arm 1900. The arm 1800 has a fork portion 1830 having two end effectors at the tip thereof, an end effector 1810 and an end effector 1820. A middle portion 1840 is connected to the root portion of a fork portion 1830 via a shaft 1850. The end effector 1810 and the end effector 1820 may be provided on the arm 1800 at different heights because the arm 1800 simultaneously transports two wafers 200. By providing the end effectors 1810 and 1820 at different heights, the position of the wafer 200 may be easily adjusted during transportation, and the transporting throughput may be improved. In the first embodiment, for example, as shown in FIG. 9, the end effector 1810 is disposed higher than the end effector 1820.

The distances $D_1$ and $D_2$ between the lower end of the first gas supply port 1460 and the surface of the wafers 200 differs when the end effector 1810 and the end effector 1820 are provided at different heights. In this case, since the conductances of the end effectors 1810 and 1820 are different, the inert gas can flow from the shorter side to the longer side. This allows the inner atmosphere or particles of one chamber to flow into another chamber. In the example of FIG. 3, the atmosphere or the particles flows from chamber 100b to chamber 100a. In this case, by adjusting the amount of the inert gas supplied by the gas supply port 1460a to be less than the amount of the inert gas supplied by the gas supply port 1460a, or the amount of the inert gas supplied by the gas supply port 1460a to be greater than the amount of the inert gas supplied by the gas supply port 1460b, the atmosphere or the particles may be suppressed from flowing to chamber 100a from chamber 100b.

The wafers 200 unloaded from the processing module 110 is placed on the end effector 1810 and the end effector 1820. FIG. 2 exemplifies the wafer 200 being unloaded from the processing module 110c.

A bottom portion 1860 is connected to the middle portion 1840 via a shaft 1870 at a position different from where the fork portion 1830 is connected. The bottom portion 1860 is disposed on the flange 1430 via the shaft 1880.

The arm 1900 has a fork portion 1930 having two end effectors at the tip thereof, an end effector 1910 and an end effector 1920. A middle portion 1940 is connected to the root portion of a fork portion 1930 via a shaft 1950. The end effector 1910 and the end effector 1920 may be provided on the arm 1900 at different heights because the arm 1900 simultaneously transports two wafers 200.

By providing the end effectors 1910 and 1920 at different heights, the position of the wafer 200 may be easily adjusted during transportation. In the first embodiment, for example, the end effector 1910 is disposed higher than the end effector 1920.

The wafer 200 unloaded from the loadlock chamber 1300 is placed on the end effector 1910 and the end effector 1920.

A bottom portion 1960 is connected to the middle portion 1940 via a shaft 1970 at a position different from where the fork portion 1930 is connected. The bottom portion 1960 is disposed on the flange 1430 via the shaft 1980.

The end effector 1810 and the end effector 1820 are disposed higher than the end effector 1910 and the end effector 1920.

The vacuum transfer robot 1700 can be rotated about an axis and the arm 1800, 1900 of the vacuum transfer robot 1700 may be extended.

<Processing Module>

Next, a processing module 110a among the processing modules 110a through 110d will be described with reference to FIGS. 1, 2, and 10. FIG. 10 schematically illustrates the configuration of the substrate processing apparatus according to the first embodiment. In FIG. 10, the processing module 110a, a gas supply unit connected to the processing module 110a and a gas exhaust unit connected to the processing module 110a are shown.

While the processing module 110a is exemplified, the processing modules 110b, 110c and 110d are the same as the processing module 110a. Accordingly, the descriptions of the processing modules 110b, 110c and 110d are omitted.

As shown in FIG. 10, the processing module 110a includes the chamber 100a and the chamber 100b, which are part of a substrate processing apparatus that processes the wafer 200. A partition wall 2040a is provided between the chamber 100a and the chamber 100b. The partition wall 2040a prevents mixing of the inner atmosphere of the chamber 100a and the chamber 100b.

As shown in FIG. 2, the substrate loading/unloading port 2060e is provided in the sidewall of the vacuum transfer chamber 1400 adjacent to the chamber 100e. Similarly, the substrate loading/unloading port 2060a is provided in the sidewall of the vacuum transfer chamber 1400 adjacent to the chamber 100a.

A substrate support unit 210 supporting the wafer 200 is provided in the chamber 100.

A gas supply unit for supplying a process gas to each of the chamber 100a and the chamber 100b is connected to the processing module 110a. The gas supply unit includes at least one of a first process gas supply unit, a second process gas supply unit, a first purge gas supply unit, and a second purge gas supply unit. The detailed configuration of the gas supply unit will be described later.

(1) Configuration of Substrate Processing Apparatus

First, the substrate processing apparatus according to the first embodiment will be described.

A substrate processing apparatus 105 according to the first embodiment will be described. The substrate processing apparatus 105 is an apparatus for forming a high dielectric constant insulating film, for example, as shown in FIG. 11, including a single wafer type substrate processing apparatus. As described above, a process for manufacturing a semiconductor device is performed using the substrate processing apparatus 105.

As shown in FIG. 11, the substrate processing apparatus 105 includes a processing vessel 202. The processing vessel 202 includes, for example, a flat, sealed vessel having a circular horizontal cross-section. The processing vessel 202 is made of a metal material such as aluminum (Al) and stainless steel (SUS) or quartz. A processing chamber 201 and a transfer chamber 203 for processing the wafer 200 such as a silicon wafer as a substrate are provided in the processing vessel 202. The processing vessel 202 includes an upper vessel 202a and a lower vessel 202b. The partition plate 204 is installed between the upper vessel 202a and the lower vessel 202b. A space above the partition plate 204 surrounded by the upper vessel 202a is referred to as the processing chamber (processing space) 201 and a space below the partition plate 204 surrounded by the lower vessel 202b is referred to as the transfer chamber 203.

The substrate loading/unloading port 1480 is installed adjacent to the gate valve 1490 at a side of the lower vessel 202b. The wafer 200 is transported between the transfer chamber 203 and the vacuum transfer chamber 1400 through the substrate loading/unloading port 1480. Lift pins 207 are installed at the bottom of the lower vessel 202b. The lower vessel 202b is electrically grounded.

The substrate support unit 210 supports the wafer 200 and is installed in the processing chamber 201. The substrate support unit 210 includes a substrate support 212 having a placing surface 211 where the wafer 200 is placed and an outer peripheral surface 215. Preferably, the substrate support unit 210 further includes a heater 213, which is a heating unit. When the substrate support unit 210 further includes the heater 213, the wafer 200 may be heated by the heater 213. As a result, the quality of the film formed on the wafer 200 can be improved. The through-holes 214 through which the lift pins 207 penetrate may be provided at positions of the substrate support 212 corresponding to the lift pins 207. The placing surface 211 provided on the surface of the substrate support 212 may be lower than the outer peripheral surface 215 by a value corresponding to the thickness of the wafer 200. The difference between the height of the upper surface of the wafer 200 and the height of the outer peripheral surface 215 of the substrate support 212 may be thereby reduced. Therefore, the turbulence of the gas caused by the difference in heights may be suppressed. The height of the outer peripheral surface 215 may be equal to or lower than the height of the placing surface 211 when the turbulence of the gas does not affect the uniformity of the processing of the wafer 200.

The substrate support 212 is supported by a shaft 217. The shaft 217 passes through the bottom of the processing vessel 202. The shaft 217 is connected to an elevating mechanism 218 at the outside of the processing vessel 202. The wafer 200 to be placed on the substrate placing surface 211 is lifted by elevating the shaft 217 and the substrate support 212 by operating the elevating mechanism 218. The bellows 219 covers the periphery of the lower end portion of the shaft 217. The interior of the processing chamber 201 is maintained airtight.

When transporting the wafer 200, the substrate support 212 is lowered until the substrate placing surface 211 reaches a position (wafer transfer position) corresponding to, for example, the substrate loading/unloading port 2060e shown in FIG. 2. When processing the wafer 200, the substrate support 212 is elevated until the wafer 200 a position (wafer processing position) in the processing chamber 201, as shown in FIG. 11.

Specifically, when the substrate support 212 is lowered to the wafer transfer position, the upper end portion of the lift pins 207 protrudes from the upper surface of the substrate placing surface 211, and the lift pins 207 supports the wafer 200 from thereunder. When the substrate support 212 is elevated to the wafer processing position, the lift pins 207 are buried from the upper surface of the substrate placing surface 211 and the substrate placing surface 211 supports the wafer 200 from thereunder. Since the lift pins 207 are in direct contact with the wafer 200, the lift pins 207 are preferably made of a material such as quartz and alumina. An elevating mechanism (not shown) may also be provided at the lift pins 207. The elevation mechanism allows the substrate support 212 and lift pins 207 to move relatively.

<Exhaust System>

An exhaust port 221, which is a first exhaust port, is installed in the upper portion of the inner wall of the processing chamber 201 (upper vessel 202a) to exhaust the inner atmosphere of the processing chamber 201. An exhaust pipe 224, which is a first exhaust pipe, is connected to the exhaust port 221. A valve 227 for adjusting the inner pressure of the processing chamber 201 to a predetermined pressure, pressure controllers 226a, 226b and 222 and a vacuum pump 223 shown in FIG. 10 are sequentially connected in series. A first exhaust unit (exhaust line) includes the exhaust port 221, the exhaust pipe 224 and the valve 227. The first exhaust unit may further include the pressure controller 226a, 226b and 222 and the vacuum pump 223 shown in FIG. 10.

A shower head exhaust port 240, which is a second exhaust port, is installed at the backside of a rectifying plate 270 defining a buffer space 232 to exhaust the inner atmosphere of the buffer space 232. The inner atmosphere of the buffer space 232 may be exhausted through the shower head exhaust port 240 via an exhaust channel (not shown) defined by the backside of the rectifying plate 270 and the exhaust guide 235. An exhaust pipe 236, which is a second exhaust pipe, is connected to the shower head exhaust port 240. A valve 237 is sequentially connected to the exhaust pipe 236 in series. A second exhaust unit (exhaust line) includes the shower head exhaust port 240, the valve 237 and the exhaust pipe 236. The exhaust pipe 236 may be connected to the vacuum pump 223.

A lower vessel exhaust port 1481 is installed in the lower vessel 202b to exhaust the inner atmosphere of the lower vessel 202b. In addition, the inner atmosphere of the upper vessel 202a may be exhausted through the lower vessel 202b and the lower vessel exhaust port 1481.

<Gas Introduction Port>

A gas introduction port 241 for supplying various gases to the processing chamber 201 is installed on the ceiling surface of a shower head 234 installed above the processing chamber 201. The configuration of the gas supply unit connected to the first gas introduction port 241 will be described later.

<Gas Dispersion Unit>

The shower head 234 includes the buffer space (buffer chamber) 232, a dispersion plate 234b and dispersion holes 234a. The shower head 234 is installed between the gas introduction port 241 and the processing chamber 201. The gas introduced through the gas introduction port 241 is supplied to the buffer space 232 (dispersion unit) of the shower head 234. The shower head 234 is made of a material such as quartz, alumina, stainless steel and aluminum.

A cover 231 of the shower head 234 may be made of a conductive metal. The cover 231 made of a conductive metal may serve as an excitation unit for exciting the gas present in the buffer space 232 or the processing chamber 201. An insulating block 233 is installed between the cover 231 and the upper vessel 202a and insulates the cover 231 from the upper vessel 202a. A matching unit 251 and a high frequency power supply 252 may be connected to electrode (cover 231) which is the activation unit. This allows an electromagnetic wave (high frequency wave or microwave) to be supplied to the electrode (cover 231).

The rectifying plate 270, which is a rectifying unit for diffusing the gas introduced through the gas introduction port 241 into the buffer space 232, is installed in the buffer space 232.

<Process Gas Supply Unit>

Figure 12:
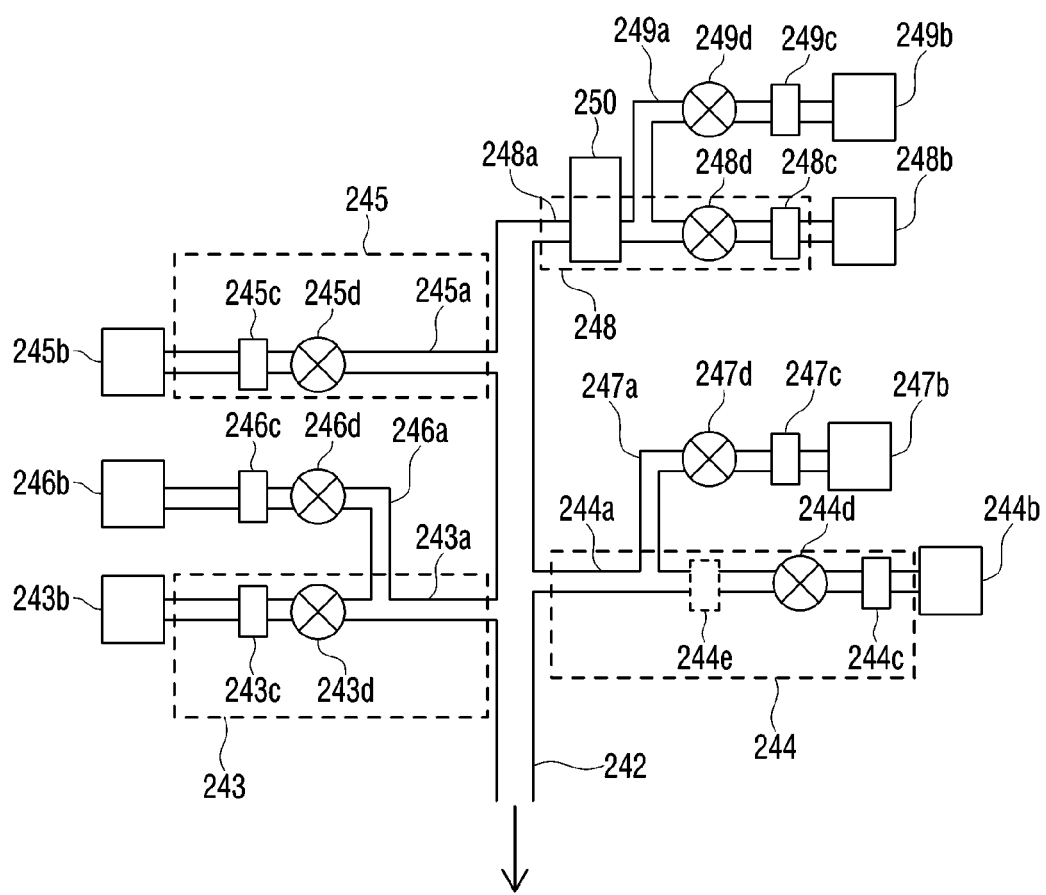
FIG. 12 illustrates the gas supply system of the substrate processing apparatus according to the first embodiment.

A common gas supply pipe 242 is connected to the gas introduction port 241 connected to the rectifying plate 270. As shown in FIG. 12, a first process gas supply pipe 243a, a second process gas supply pipe 244a, a purge gas supply pipe 245a and a cleaning gas supply pipe 248a are connected to the common gas supply pipe 242.

A first element-containing gas (first process gas) is supplied mainly through a first process gas supply unit 243 including the first process gas supply pipe 243a. A second process gas (second element-containing gas) is supplied mainly through a second process gas supply unit 244 including the second process gas supply pipe 244a. The purge gas is mainly supplied through a purge gas supply unit 245 including the purge gas supply pipe 245a. The cleaning gas is mainly supplied through a cleaning gas supply unit 248 including the cleaning gas supply pipe 248a.

<First Process Gas Supply Unit>

A first process gas source 243b, a mass flow controller 243c which is flow rate controller (flow rate control unit), and an on/off valve 243d are connected to the first process gas supply pipe 243a in order from the upstream side to the downstream side of the first process gas supply pipe 243a.

The first element-containing gas (first process gas) is supplied from the first process gas source 243b. The first process gas is supplied to the buffer space 232 via the mass flow controller 243c and the valve 243d provided in the first process gas supply pipe 243a and the common gas supply pipe 242.

The first process gas is one of the source gases, or process gases. In the first embodiment, the first element includes, for example, silicon (Si). The first process gas is, for example, a silicon-containing gas. For example, dichlorosilane (SiH$_2$Cl$_2$): DCS] gas may be used as the silicon-containing gas. The first process gas precursor may be solid, liquid or gas at room temperature and under normal pressure. When the first process gas precursor is liquid at room temperature and under normal pressure, a vaporizer (not shown) may be installed between the first process gas source 243b and the mass flow controller 243c. In the first embodiment, an example wherein the first process gas precursor is gaseous is described.

The downstream end of a first inert gas supply pipe 246a is connected to the first process gas supply pipe 243a at the downstream side of the valve 243d provided in the first process gas supply pipe 243a. An inert gas source 246b, a mass flow controller 246c as a flow rate controller and an on/off valve 246d are installed at the first inert gas supply pipe 246a in order from the upstream side to the downstream side of the first inert gas supply pipe 246a.

In the first embodiment, the inert gas includes, for example, nitrogen (N$_2$) gas. Instead of N$_2$ gas, rare gases such as helium (He) gas, neon (Ne) gas and argon (Ar) gas may be used as the inert gas.

A first element-containing gas supply unit 243 (also referred to as silicon-containing gas supply unit) includes the first process gas supply pipe 243a, the mass flow controller 243c and the valve 243d.

A first inert gas supply unit includes the first inert gas supply pipe 246a, the mass flow controller 246c, and the valve 246d. The first inert gas supply unit may further include the inert gas source 246b and the first process gas supply pipe 243a.

The first element-containing gas supply unit 243 may further include the first process gas source 243b and the first inert gas supply unit.

<Second Process Gas Supply Unit>

A second process gas source 244b, the mass flow controller 244c, which is a flow rate controller, and an on/off valve 244d are installed at the second process gas supply pipe 244a in order from the upstream side to the downstream side of the second process gas supply pipe 244a.

A second element-containing gas (hereinafter referred to as "second process gas") is supplied from the second process gas source 244b. The second process gas is supplied to the buffer space 232 via the mass flow controller 244c and the valve 244d provided in the second process gas supply pipe 244a and the common gas supply pipe 242.

The second process gas is one of the process gases. The second process gas may be a reactive gas that reacts with one of the process gases. The second process gas may be a modifying gas that reacts with the film formed on the substrate.

In the first embodiment, the second process gas contains a second element that is different from the first element. The second element includes, for example, oxygen (O), nitrogen (N), carbon (C) or hydrogen (H). In the first embodiment, the second process gas includes, for example, a nitrogen-containing gas. Specifically, ammonia (NH$_3$) gas may be used as the nitrogen-containing gas.

The second process gas supply unit 244 includes the second process gas supply pipe 244a, the mass flow controller 244c and the valve 244d.

The second process gas supply unit 244 may further include a remote plasma unit (RPU) 244e, which is an activation unit. The remote plasma unit (RPU) 244e, which is an activation unit, may be installed at the second process gas supply pipe 244a. The remote plasma unit 244e may activate the second process gas.

The downstream end of the second inert gas supply pipe 247a is connected to the second process gas supply pipe 244a at the downstream side of the valve 244d provided in the second process gas supply pipe 244a. An inert gas source 247b, a mass flow controller 247c, which is a flow rate controller, and the on/off valve 247d are installed at the second inert gas supply pipe 247a in order from the upstream side to the downstream side of the second inert gas supply pipe 247a.

The inert gas is supplied via the second inert gas supply pipe 247a. The inert gas is supplied to the buffer space 232 through the mass flow controller 247c and the valve 247d provided in the second inert gas supply pipe 247a and the second gas supply pipe 244a. The inert gas acts as a carrier gas or diluting gas in the film-forming step S203 through S207.

The second inert gas supply unit includes the second inert gas supply pipe 247a, the mass flow controller 247c and the valve 247d. The second inert gas supply unit may further include the inert gas source 247b and the second process gas supply pipe 244a.

The second process gas supply unit 244 may further include the second process gas source 244b and the second inert gas supply unit.

<Purge Gas Supply Unit>

A purge gas source 245b, a mass flow controller 245c which is a flow rate controller, and an on/off valve 245d are installed at the purge gas supply pipe 245a in order from the upstream side to the downstream side of the purge gas supply pipe 245a.

A purge gas, which may be an inert gas, is supplied from the purge gas source 245b. The purge gas is supplied to the buffer space 232 via the mass flow controller 245c and the valve 245d provided in the purge gas supply pipe 245a and the common gas supply pipe 242.

In the first embodiment, the purge gas includes, for example, nitrogen (N$_2$) gas. Instead of N$_2$ gas, rare gases such as helium (He) gas, neon (Ne) gas and argon (Ar) gas may be used as the purge gas.

The purge gas supply unit 245 includes the purge gas supply pipe 245a, the mass flow controller 245c and the valve 245d.

<Cleaning Gas Supply Unit>

A cleaning gas source 248b, a mass flow controller 248c, a valve 248d and a remote plasma unit (RPU) 250 are installed at the cleaning gas supply pipe 248a in order from the upstream side to the downstream side of the cleaning gas supply pipe 248a.

The cleaning gas is supplied from the cleaning gas source 248b. The cleaning gas is supplied to the buffer space 232 through the mass flow controller 248c, the valve 248d and the RPU 250 provided in the cleaning gas supply pipe 248a and the common gas supply pipe 242.

The downstream end of a fourth inert gas supply pipe 249a is connected to the cleaning gas supply pipe 248a at the downstream side of the valve 248d provided in the cleaning gas supply pipe 248a. A fourth inert gas source 249b, a mass flow controller 249c and a valve 249d are installed at the fourth inert gas supply pipe 249a in order from the upstream side to the downstream side of the fourth inert gas supply pipe 249a.

The cleaning gas supply unit includes the cleaning gas supply pipe 248a, the mass flow controller 248c, and the valve 248d. The cleaning gas supply unit may further include the cleaning gas source 248b, the fourth inert gas supply pipe 249a and the RPU 250.

The inert gas supplied from the fourth inert gas source 249b may act as a carrier gas or diluting gas of the cleaning gas.

The cleaning gas supplied from the cleaning gas source 248b removes materials such as by-products attached to the shower head 234 or the processing chamber 201 in the cleaning step.

In the first embodiment, the cleaning gas includes, for example, nitrogen trifluoride ($NF_3$) gas. For example, any one of hydrogen fluoride (HF) gas, chlorine trifluoride gas ($ClF_3$) gas and fluorine ($F_2$) gas and combinations thereof may be used as the cleaning gas.

Preferably, a valve responsive to a gas flow such as a needle valve and an orifice valve may be used as a flow rate control unit installed in each gas supply unit described above. For example, when a gas pulse width is in millisecond order, the mass flow controller can not respond. However, the needle valve or orifice valve can respond to sub-millisecond gas pulses when combined with a high speed on/off valve.

<Control Unit>

Figure 13:
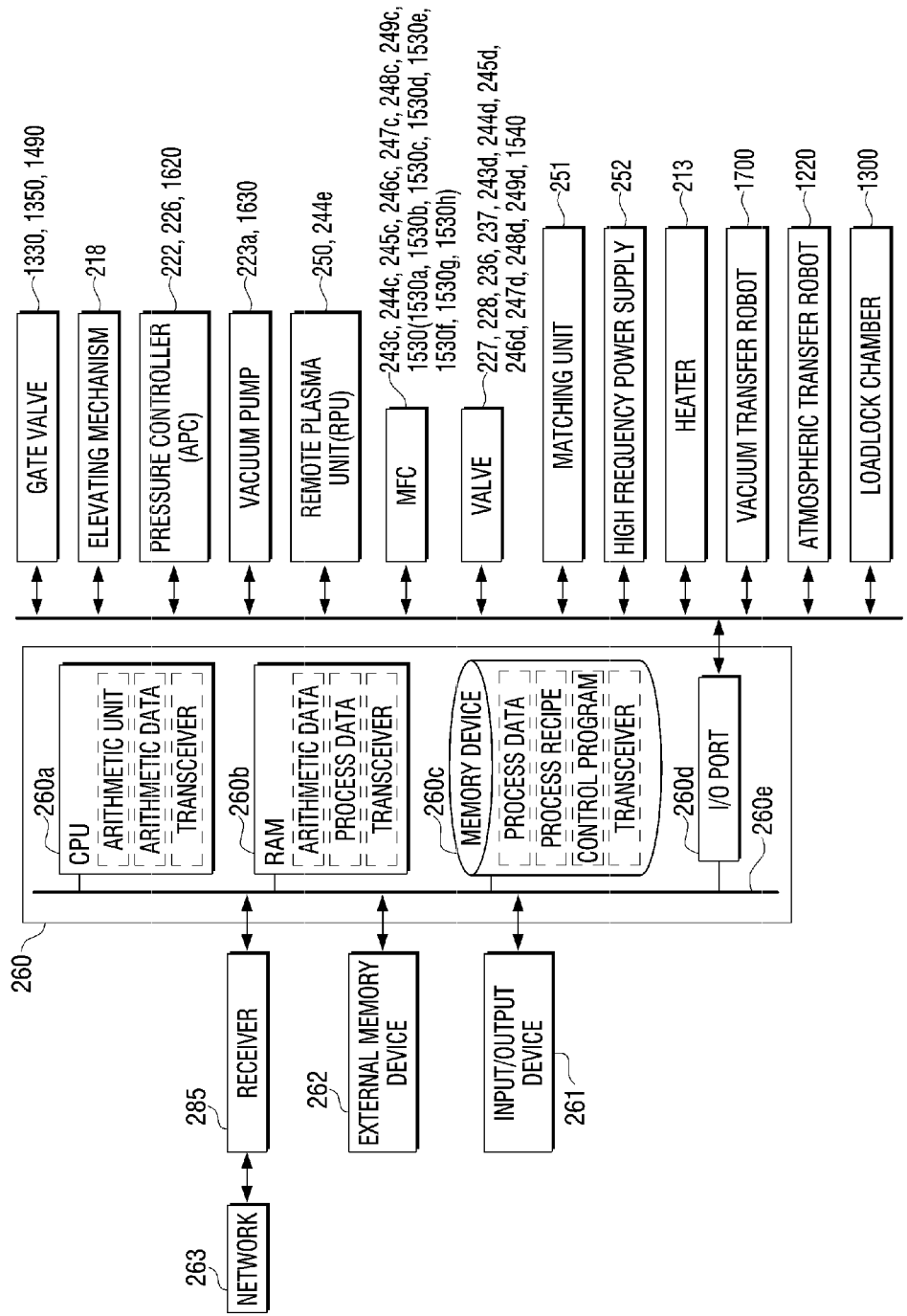
FIG. 13 schematically illustrates a controller of the substrate processing system according to the first embodiment.

As shown in FIG. 13, the substrate processing apparatus 105 includes a control unit 260 configured to control the operations of the components of the substrate processing apparatus 105.

FIG. 13 schematically illustrates the configuration of the control unit 260. The control unit 260 may be embodied by a computer having a central processing unit (CPU) 260a, a random access memory (RAM) 260b, a memory device 260c and an I/O port 260d. The RAM 260b, the memory device 260c and the I/O port 260d can exchange data with the CPU 260a via an internal bus 260e. An input/output device 261 such as a touch panel, an external memory device 262, and a receiver 285 may be connected to the control unit 260.

The memory device 260c is embodied by components such as a flash memory and a hard disk drive (HDD). A control program for controlling the operation of the substrate processing apparatus, a process recipe having information such as sequences and conditions of substrate processing and arithmetic data or process data generated when the process recipe is used to process the wafer 200 are readably stored in the memory device 260c. The process recipe functioning as a program enables the control unit 260 to execute predetermined steps of the substrate processing to obtain a predetermined result. Hereinafter, the process recipe and control program may also be collectively referred to as "program". Hereinafter, "program" refers to only the process recipe, only the control program, or both. The RAM 260b functions as a work area in which data such as the program, the arithmetic data and the process data read by the CPU 260a are temporarily stored.

The I/O port 260d is connected to components such as the gate valves 1330, 1350 and 1490, the elevating mechanism 218, the heater 213, the pressure controllers 222, 226 and 1620, the vacuum pumps 223 and 1630, the matching unit 251, the high frequency power supply 252, the mass flow controllers 243c, 244c, 245c, 246c, 247c, 248c, 249c and 1530, the valves 227, 228, 236, 237, 243d, 244d, 245d, 246d, 247d and 1540 and remote plasma units (RPU) 244e and 250.

The CPU 260a, which is an arithmetic unit, reads and executes the control program from the memory device 260c, and reads the process recipe in accordance with commands such as an operation command inputted through the input/output device 260. The CPU 260a may compute the arithmetic data by comparing the value inputted through the receiver 285 with the process recipe or control data stored in the memory device 121c. The CPU 260a can execute processing for determining the process data (process recipe) based on the arithmetic data. The CPU 260a controls the opening and closing operations of the gate valves 1330, 1350 and 1490 (1490a, 1490b, 1490c, 1490d, 1490e, 1490f, 1490g and 1490h), operation of elevating mechanism 218, operation of supplying electrical power to the heater 213, operation of adjusting pressure by the pressure controllers 222, 226 and 1620, on/off control of the vacuum pump 223, operation of activating the gas by the remote plasma units 244e and 250, opening/closing operations of the valves 227, 228, 236, 237, 243d, 244d, 245d, 246d, 247d, 248d, 249d and 1540, matching operation of the matching unit 251 and the on/off operation of the high frequency power supply 252 according to the contents of the process recipe.

The control unit 260 may be embodied by a general purpose computer as well as a dedicated computer. The control unit 260 according to the first embodiment may be embodied by preparing the external memory device 262 (e.g. magnetic tape, magnetic disk such as a flexible disk and a harddisk, optical disks such as CD and DVD, magneto-optical disks such as MO, semiconductor memories such as a USB memory and memory cards) and installing the program on a general-purpose computer using the external memory device 262. The method of installing the program to the computer is not limited to the external memory device 262. The program may be directly provided to the computer without the external memory device 262 using the receiver 285 and a communication means such as a network 263 (e.g. Internet or a dedicated communication line). The memory device 260c and the external memory device 262 may be embodied by computer-readable storage media. Hereinafter, the memory device 260c and the external memory device 262 are collectively referred to as storage media. Hereinafter, "storage media" may refer to only the memory device 260c, only the external memory device 262, or both.

(2) Substrate Processing

Next, as an example of a semiconductor device manufacturing process using the substrate processing apparatus described above, an example sequence for forming on a substrate a silicon nitride film (SiN film) which is an insulating film and a silicon-containing film, will be described with reference to FIG. 14 and FIG. 15. Hereinafter, the control unit 260 controls the operation of the components of the substrate processing apparatus.

Hereinafter, the term "wafer" refers to "wafer itself" or "the wafer and the laminated structure of layers or films formed on the surface of the wafer". That is, the term "wafer" refers to "wafer including layers or films formed on the surface of the wafer." Hereinafter, the term "the surface of the wafer" refers to "exposed surface of the wafer itself" or "top surface of the laminated structure of layers or films."

Hereinafter, "supplying a predetermined gas to a wafer" may refer to "directly supplying a predetermined gas to the exposed surface of the wafer itself" or "supplying a predetermined gas to the top surface of the laminated structure of layer or film formed on the wafer." "supplying a predetermined gas to a wafer" may refer to "forming a predetermined layer (or film) on the top surface of the laminated structure of a layer or film."

Hereinafter, the term "substrate" is substantially the same as the term "wafer." That is, the term "substrate" may be substituted by "wafer" and vice versa.

Next, substrate processing is described in detail.

<Substrate Loading Step S201>

First, in order to perform a substrate processing, the wafer 200 is loaded into the processing chamber 201. Specifically, the substrate support unit 210 is lowered by the elevating mechanism 218, and the lift pins 207 protrude from the upper surface of the substrate support unit 210 through the through-holes 214. The inert gas is supplied into the processing chamber 201 and the transfer chamber 203 and exhausted through the lower vessel exhaust port 1481. The inner pressure of the processing chamber 201 and the inner pressure of the transfer chamber 203 are thereby adjusted to a predetermined pressure. After the inner pressure of the processing chamber 201 and the inner pressure of the transfer chamber 203 are adjusted, the gate valve 1490 is opened. The wafer 200 is placed on the lift pins 207 through the gate valve 1490. After the wafer 200 is placed on the lift pins 207, the wafer support unit 210 is elevated to a predetermined position by the elevating mechanism 218 so that the wafer 200 is lifted from the lift pins 207 to the substrate support unit 210. Before the gate valve 1490 is opened, the inert gas is supplied by the first gas supply unit 1500 to the location where through the wafer 200 passes. Preferably, the APC 1620 and the valve 227 are closed so that inert gas is not exhausted through exhaust port 221 or exhaust port 1470. As a result, the inert gas flows in the direction indicated by the dashed line arrow shown in FIG. 2, which suppresses the backflow from the chamber 100a to the vacuum transfer chamber 1400.

When the wafer 200 is placed on the substrate support unit 210 and the substrate support 212 reaches the wafer processing position shown in FIG. 11, the inner atmosphere of the processing chamber 201 is exhausted through the exhaust port 221 by opening the valve 227. After closing the gate valve 1490, the exhausting of the lower vessel 202b is stopped by closing the valve 228 connected to the lower vessel exhaust port 1481.

After closing the gate valve 1490a and the supply of the inert gas by the inert gas supply unit 1500a is stopped. When the gate valves 1490b, 1490c, 1490d, 1490e, 1490f, 1490g, 1490h and 1350 other than the gate valve 1490a are open, the inert gas is continuously supplied by the inert gas supply unit 1500b, 1500c, 1500d, 1500e, 1500f, 1500g and 1500h corresponding to the gate valves 1490b, 1490c, 1490d, 1490e, 1490f, 1490g, 1490h and 1350.

<Depressurizing and Temperature Elevating Step S202>

Next, the processing chamber 201 is exhausted through the processing chamber exhaust pipe 224 until the inner pressure of the processing chamber 201 reaches a predetermined pressure (vacuum level). At this time, the opening degree of the valve body of the APC 222, which is the pressure controller, is feedback-controlled based on the pressure measured by a pressure sensor (not shown). The amount of current to the heater 213 is feedback-controlled based on the temperature detected by a temperature sensor (not shown) until the inner temperature of the processing chamber 201 reaches a predetermined temperature. Specifically, the substrate support unit 210 is preliminarily heated by the heater 213 until the temperature of the wafer 200 or the substrate support unit 210 is stabilized. In the meantime, when moisture or gas desorbed from the processing chamber 201 is present, the moisture or the desorbed gas may be purged by a vacuum exhaust or supplying $N_2$ gas. Thus, preparation for the film-forming process is completed. When the processing chamber 201 is exhausted until the inner pressure of the processing chamber 201 reaches the predetermined pressure, the processing chamber 201 may be exhausted to a vacuum level that can be reached at a time.

<Film-Forming Step S301>

Next, an example of forming a SiN film on the wafer 200 will be described. The details of the film-forming step S301 will be described with reference to FIG. 14 and FIG. 15.

Figure 14:
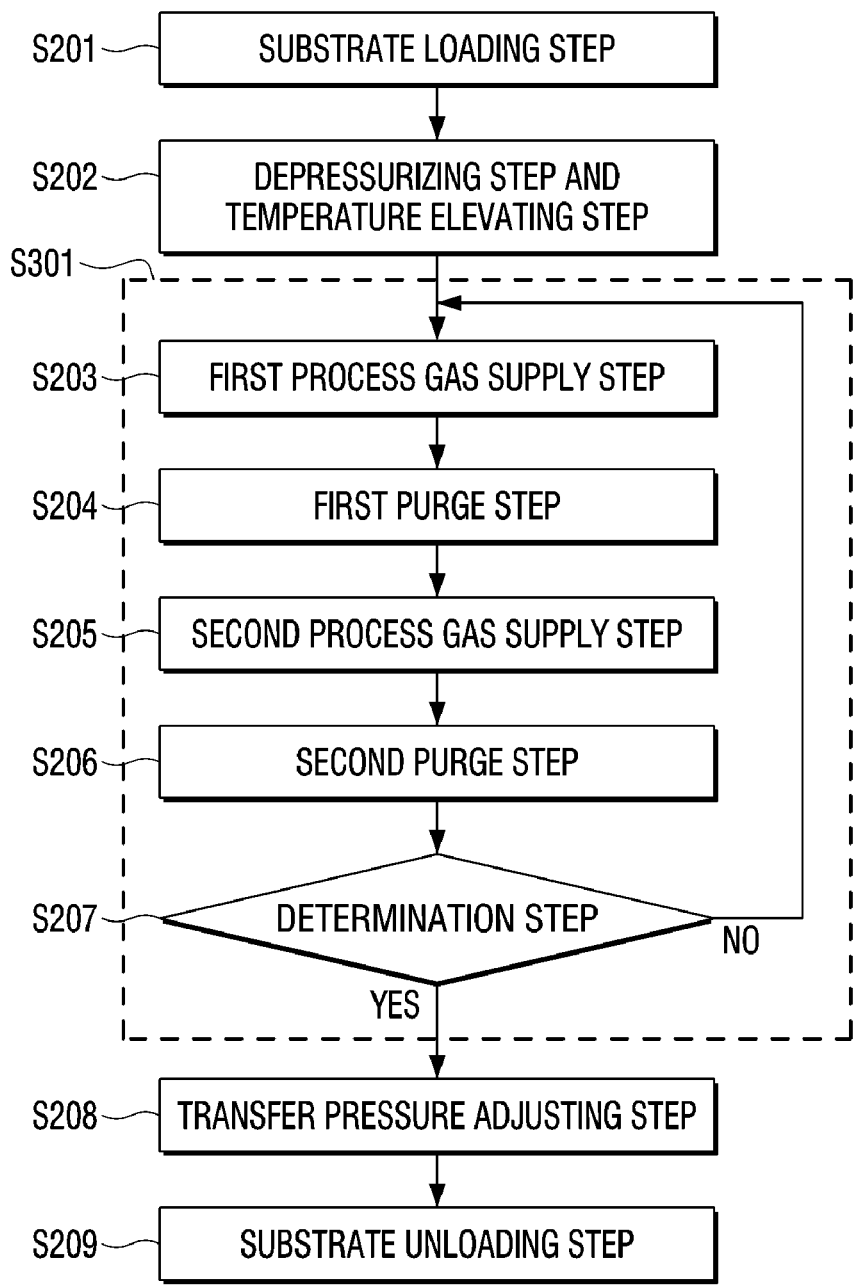
FIG. 14 is a flow chart of substrate processing according to the first embodiment.
Figure 15:
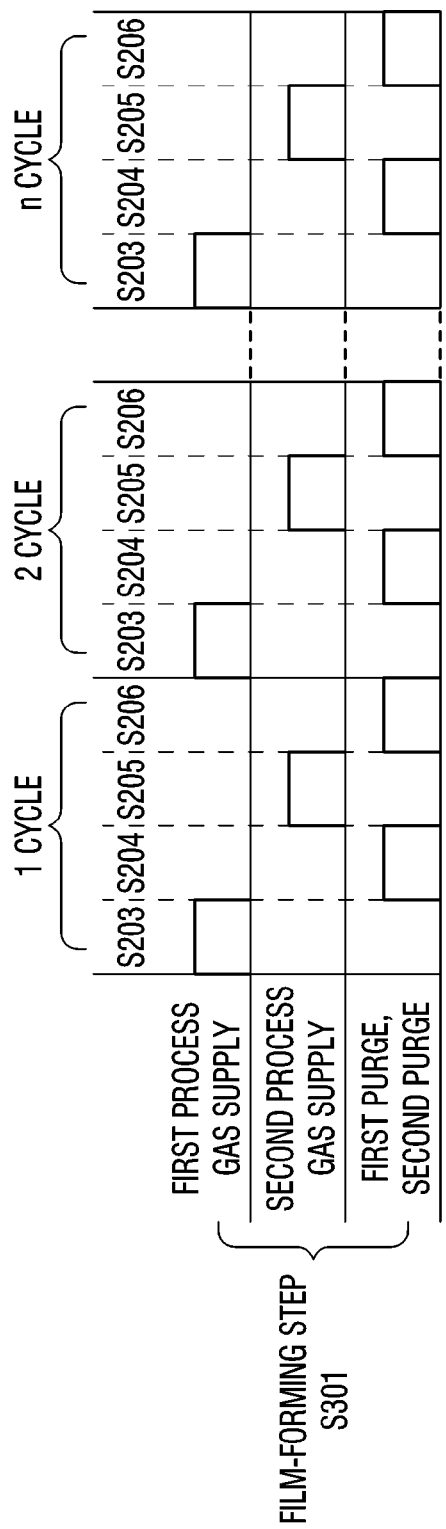
FIG. 15 is a sequence diagram of substrate processing according to the first embodiment.

After the wafer 200 is placed on the substrate support unit 210 and the inner atmosphere of the processing chamber 201 is stabilized, steps S203 through S207 shown in FIG. 14 are performed.

<First Process Gas Supply Step S203>

In the first process gas supply step S203, the silicon-containing gas, which is the first process gas, is supplied into the processing chamber 201 by the first process gas supply unit 243. The silicon-containing gas includes, for example, dichlorosilane (DCS). Specifically, by opening the valve 243d, the silicon-containing gas is supplied into the chamber 100 from the first process gas source 243b. The flow rate of the silicon-containing gas supplied by opening the valve 243d is adjusted to a predetermined value by the mass flow controller 243c. The silicon-containing gas having the adjusted flow rate is supplied into the processing chamber 201, which is under a reduced pressure, through the buffer space 232 and the dispersion holes 234a of the shower head 234. The processing chamber 201 is continuously exhausted by the exhaust system so that the inner pressure of the processing chamber 201 is maintained at the predetermined pressure range. At this time, the silicon-containing gas supplied to the wafer 200 is supplied into the processing chamber 201 at a predetermined pressure (first pressure ranging from 100 Pa to 20000 Pa). As a result, the silicon-containing gas is supplied to the wafer 200 and a silicon-containing layer is formed on the wafer 200.

<First Purge Step S204>

After the silicon-containing layer is formed on the wafer 200, the supply of the silicon-containing gas is stopped. The first purge step S204 is performed by stopping the supply of the source gas and discharging the source gas present in the processing chamber 201 or the buffer space 232 through the processing chamber exhaust pipe 224.

In the first purge step S204, the gas remaining in the processing chamber 201 may be exhausted by supplying an inert gas as well as simply discharging the gas by exhausting the gas (vacuum exhaust). In the first purge step S204, the vacuum exhaust and the supply of the inert gas may be combined. In the first purge step S204, the vacuum exhaust and the supply of the inert gas may be alternately performed.

At this time, the valve 237 of the shower head exhaust pipe 236 may be opened and the gas present in the buffer space 232 may be exhausted through the shower head exhaust pipe 236. The pressure controller 227 and the valve 237 control the inner pressure (exhaust conductance) of the shower head exhaust pipe 236 and the buffer space 232 while performing the exhaust. The pressure controller 227 and the valve 237 are controlled such that the exhaust conductance through the shower head exhaust pipe 236 of the buffer space 232 is higher than the exhaust conductance through the processing chamber exhaust pipe 224 via the processing chamber 201. By controlling the exhaust conductance, the gas flows from the gas introduction port 241, which is one end of the buffer space 232, toward the showerhead exhaust port 240, which is the other end. The gas attached to the wall of the buffer space 232 or the gas floating in the buffer space 232 is thereby exhausted through the shower head exhaust pipe 236 without entering the processing chamber 201. The inner pressure of the buffer space 232 and the inner (exhaust conductance) of the processing chamber 201 may be adjusted so as to prevent the gas from flowing back into the buffer space 232 from the processing chamber 201.

In the first purge step S204, the vacuum pump 223 continues to operate to exhaust the gas present in the processing chamber 201. The pressure controller 227 and the valve 237 can be controlled so that the exhaust conductance from the processing chamber 201 to the processing chamber exhaust pipe 224 is higher than the exhaust conductance from the processing chamber 201 to the buffer space 232. Thus, since the gas flows from the processing chamber 201 toward the processing chamber exhaust pipe 224, the gas remaining in the processing chamber 201 can be exhausted.

After a predetermined time elapses, the supply of the inert gas is stopped, and the valve 237 is closed to block the flow path from the buffer space 232 to the shower head exhaust pipe 236.

More preferably, it is desirable to close the valve 237 while continuously operating the vacuum pump 223 after the predetermined time elapses. The gas flow toward the processing chamber exhaust pipe 224 via processing chamber 201 is thereby not affected by the shower head exhaust pipe 236. Therefore, since the inert gas can be supplied to the substrate more reliably, the gas remaining on the substrate may be removed more efficiently.

Purging the inner atmosphere of the processing chamber 201 may include supplying an inert gas to exhaust the gas as well as simply discharging the gas by vacuum-exhausting the gas. Therefore, in the first purge step S204, the inert gas may be supplied into the buffer space 232 to perform a discharging operation of extruding gas remaining in the processing chamber 201. In the first purge step S204, the vacuum exhaust and the supply of the inert gas may be combined. In the first purge step S204, the vacuum exhaust and the supply of the inert gas may be alternately performed.

At this time, it is not necessary for the flow rate of $N_2$ gas supplied into the processing chamber 201 to be high. For example, the volume of the supplied $N_2$ gas may be the same as the volume of the processing chamber 201. By purging in this way, the influence on the next step can be reduced. By not completely purging the processing chamber 201, the purge time can be shortened and manufacturing throughput can be improved. The consumption of $N_2$ gas can also be minimized.

At this time, the temperature of the heater 213 ranges from 200° C. to 750° C., preferably from 300° C. to 600° C., more preferably from 300° C. to 550° C. similar to the case of supplying source gas to the wafer 200. The flow rate of $N_2$ gas, which is a purge gas supplied through each inert gas supply system, ranges, for example, from 100 sccm to 20000 sccm. Instead of $N_2$ gas, rare gases such as argon (Ar) gas, helium (He) gas, neon (Ne) gas and xenon (Xe) gas may be used as the inert gas.

<Second Process Gas Supply Step S205>

After the first purge step S204 is performed, a nitrogen-containing gas, which is the second process gas, is supplied into the processing chamber 201 via the gas introduction port 241 and the dispersion holes 234a. In the first embodiment, ammonia gas ($NH_3$), for example, is used as the nitrogen-containing gas. Since the nitrogen-containing gas is supplied into the processing chamber 201 through the dispersion holes 234a, the nitrogen-containing gas may be uniformly supplied onto the substrate. Therefore, the uniform film thickness may be obtained. The second process gas may be supplied into the processing chamber 201 in an activated state by the remote plasma unit (RPU), which is an activation unit (excitation unit).

At this time, the mass flow controller adjusts the flow rate of $NH_3$ gas to a predetermined flow rate. The flow rate of the supplied $NH_3$ gas ranges, for example, from 100 sccm to 10000 sccm. While the $NH_3$ gas passes through the RPU, RPU the is turned on (power is applied) such that the RPU activates (excites) the $NH_3$ gas.

When $NH_3$ gas is supplied to the silicon-containing layer formed on the wafer 200, the silicon-containing layer is modified. For example, the silicon-containing layer becomes a modified layer containing silicon. By supplying $NH_3$ gas activated by the RPU onto the wafer 200, a further modified layer can be formed.

The modified layer may have a predetermined thickness, a predetermined distribution, and a predetermined penetration depth of nitrogen for the silicon-containing layer depending on the inner pressure of the processing chamber 201, the flow rate of the $NH_3$ gas, the temperature of the wafer 200 and current supplied to the RPU.

After a predetermined time elapses, the supply of $NH_3$ gas is stopped.

<Second Purge Step S206>

The second purge step S206 is performed by stopping the supply of the $NH_3$ gas and exhausting the $NH_3$ gas present in the processing chamber 201 or the $NH_3$ gas present in the second buffer space 232 by the first exhaust unit. The second purge step S206 is substantially the same as the first purge step S204 described above.

In the second purge step S206, the vacuum pump 223 is continuously operated to exhaust the gas present in the processing chamber 201 through the processing chamber exhaust pipe 224. The pressure controller 227 and the valve 237 are controlled so that the exhaust conductance from the processing chamber 201 to the processing chamber exhaust pipe 224 is higher than the exhaust conductance from the processing chamber 201 to the buffer space 232. Accordingly, since the gas flows toward the processing chamber exhaust pipe 224 via the processing chamber 201, the gas remaining in the processing chamber 201 can be exhausted. By supplying an additional inert gas, the inert gas may be reliably supplied to the substrate. Thus, the gas remaining on the substrate may be removed more efficiently.

After a predetermined time elapses, the supply of the inert gas is stopped, and the buffer space 232 is block from the shower head exhaust pipe 236 by closing the valve 237.

More preferably, after the predetermined time elapses, the vacuum pump 223 is continuously operated and the valve 237 is closed. The gas flowing toward the shower head exhaust pipe 236 via the processing chamber 201 is thereby not affected by processing chamber exhaust pipe 224. As a result, inert gas can be supplied more reliably onto the substrate. Therefore, the gas remaining on the substrate may be removed more efficiently.

Purging the inner atmosphere of the processing chamber 201 may include supplying an inert gas to exhaust the gas as well as simply discharging the gas by vacuum-exhausting the gas. The vacuum exhaust and the supply of the inert gas may be combined. The vacuum exhaust and the supply of the inert gas may alternately be performed.

At this time, it is not necessary for the flow rate of $N_2$ gas supplied into the processing chamber 201 to be high. For example, the volume of the supplied $N_2$ gas may be the same as the volume of the processing chamber 201. By purging in this way, the influence on the next step can be reduced. By not completely purging the processing chamber 201, the purge time can be shortened and manufacturing throughput can be improved. The consumption of $N_2$ gas can also be minimized.

At this time, the temperature of the heater 213 ranges from 200° C. to 750° C., preferably from 300° C. to 600° C., more preferably from 300° C. to 550° C. similar to the case of supplying source gas to the wafer 200. The flow rate of $N_2$ gas, which is a purge gas supplied through each inert gas supply system, ranges, for example, from 100 sccm to 20000 sccm. Instead of $N_2$ gas, rare gases such as argon (Ar) gas, helium (He) gas, neon (Ne) gas and xenon (Xe) gas may be used as the inert gas.

<Determination Step S207>

After the second purge step S206 completed, the control unit 260 determines whether the steps S203 through S206 of the film-forming step S301 have been performed for a predetermined number of cycles (n times, where n is a natural number). In other words, the control unit 260 determines whether a film having a desired thickness is formed on the wafer 200. By performing the above-described steps S203 through S206 as one cycle and performing the cycle at least once, an insulating film including silicon and nitrogen having a predetermined thickness, i.e., an SiN film, may be formed on the wafer 200. The above-described cycle may be repeated a plurality of times. Thereby, a SiN film having a predetermined thickness is formed on the wafer 200.

When it is determined in step S207 that the cycle has not been performed the predetermined number of times (n times) (N of S207), the cycle including steps S203 through S206 is repeated. When it is determined in step S207 that the cycle has been performed the predetermined number of times (Y in S207), the film-forming step S301 is terminated. Next, a transfer pressure adjusting step S208 and a substrate unloading step S209 are performed.

<Transfer Pressure Adjusting Step S208>

In the transfer pressure adjusting step S208, the inert gas is supplied into the processing chamber 201 until the inner pressure of the processing chamber 201 or the inner pressure of the transfer chamber 203 reaches a predetermined level. As a result, the inner atmosphere of the processing chamber 201 is exhausted through the processing chamber exhaust pipe 224. By opening the valve 228, the inner atmosphere of the transfer chamber 203 is exhausted through the lower vessel exhaust port 1481. At this time, the inner pressure of the processing chamber 201 or the inner pressure of the transfer chamber 203 is adjusted to be lower than the inner pressure of the vacuum transfer chamber 1400.

<Substrate Unloading Step S209>

After the inner pressure of the processing chamber 201 is adjusted to the predetermined pressure in the transfer pressure adjusting step S208, the substrate support unit 210 is lowered by the elevating mechanism 218, and the lift pins 207 protrudes from toward the upper surface of the substrate support unit 210 through the through-holes 214. The wafer 200 is thereby placed on the lift pins 207. After the substrate support unit 210 is lowered, the exhaust through the processing chamber exhaust pipe 224 is stopped by closing the valve 227. A gas flow is formed such that the inert gas supplied through the gas introduction port 241 is exhausted through the lower vessel exhaust port 1481. The wafer 200 supported by the lift pins 207 may be in standby until the temperature of the wafer 200 is reduced to a predetermined temperature before the wafer 200 is unloaded. The inner pressure of the processing chamber 201 and the inner pressure of the transfer chamber 203 are maintained at the same level as the inner pressure of the vacuum transfer chamber 1400 or the pressure of the film-forming step S301. By increasing the inner pressure of the processing chamber 201 and the inner pressure of the transfer chamber 203, the time for cooling the wafer 200 can be shortened. After the wafer 200 is cooled, the inner pressure of the processing chamber 201 and the inner pressure of the transfer chamber 203 are adjusted to be lower than the inner pressure of the vacuum transfer chamber 1400.

After the gas flow is formed, the inert gas is supplied from the first gas supply unit 1500 of the vacuum transfer chamber 1400 toward the location near the opening of the gate valve 1490 wherethrough the wafer 200 passes. After initiating the supply of the inert gas, the gate valve 1490 is opened and the wafer 200 placed on the lift pins 207 is transported to the vacuum transfer chamber 1400. After the wafer 200 is transported to the vacuum transfer chamber 1400, the gate valve 1490 is closed and the APC 1620 is opened so that the inner atmosphere of the vacuum transfer chamber 1400 is exhausted through the gas exhaust unit 1600. Accordingly, even when foreign substances are mixed with the inner atmosphere of the vacuum transfer chamber 1400, the foreign substance can be exhausted without passing through the processing chamber 201. That is, foreign substance may be prevented from entering the processing chamber 201.

Before the substrate support unit 210 is moved to the wafer transfer position indicated by the dashed line in FIG. 11, the following operations may be performed. The inert gas may be supplied to the lower vessel exhaust port 1481 through the gas introduction port 241 and the transfer chamber 203. The pressures of processing chamber 201, vacuum transfer chamber 1400 and transfer chamber 203 are adjusted such that the pressure of the processing chamber 201 is higher than the pressure of the vacuum transfer chamber 1400 and the pressure of the vacuum transfer chamber 1400 is higher than the pressure of the transfer chamber 203. After the pressures are adjusted, the inert gas is supplied by the first gas supply unit 1500 to the location near the opening of the gate valve 1490 wherethrough the wafer 200 passes. After starting the supply of the inert gas, the gate valve 1490 is opened. In this case, the inert gas supplied by the first gas supply unit 1500 flows from the gate valve 1490 to the lower vessel exhaust port 1481. The substrate support unit 210 is then returned to the wafer transfer position. After the substrate support unit 210 is returned to the wafer transfer position, the vacuum transfer robot 1700 transfers the wafer 200 to the vacuum transfer chamber 1400. By performing above-described operations, the gases in the transfer chamber 203 and the processing chamber 201 may be prevented from flowing into the vacuum transfer chamber 1400. By connecting the processing chamber 201, the transfer chamber 203 and the vacuum transfer chamber 1400 in such a stepwise manner, the diffusion of the gas due to the pressure differences between the processing chamber 201, the transfer chamber 203 and the vacuum transfer chamber 1400 may be suppressed.

By above-described steps, the wafer 200 is processed.

(3) Effect of the First Embodiment

According to the first embodiment, at least one of effects (a) through (e) below may be provided.

(a) Since the inert gas is supplied by the first gas supply unit 1500 to the location near the opening of the gate valve wherethrough the wafer passes and is exhausted through the lower vessel exhaust port 1481, the by-products or particles present in the chamber 100 may be suppressed from entering the vacuum transfer chamber 1400.

(b) The inner atmosphere or particles of one chamber may be suppressed from being introduced into another chamber.

(c) When the two end effectors of on the arm are provided at different heights, the gas may be prevented from diffusing (moving) between chambers by adjusting the flow rates of the inert gas supplied through the two gas supply ports of the first gas supply unit 1500 to be different from each other.

(d) Since the distances $D_1$ and $D_2$ between the lower end of the first gas supply port 1460 and the surfaces of the wafers 200 and the thickness L of the gas guide 1461 satisfy $D_1$, $D_2$<L, reactive gas, by-products and particles is suppressed from entering the vacuum transfer chamber 1400 by removing at least one of the process gas, the reactive gas, the by-products and the particles adhered to the surface of the wafer 200.

(e) When the distance $D_1$ between the lower end of the first gas supply port 1460 and the wafer 200 supported by the upper arm 1800 is greater than the distance $D_2$ between the lower end of the first gas supply port 1460 and the wafer 200 supported by the lower arm 1900, the inner atmosphere of the chamber 100 can be prevented from entering the vacuum transfer chamber 1400 by adjusting the amount of inert gas supplied toward the wafer 200 supported by the lower arm 1900 to be greater than the amount of inert gas supplied toward the wafer 200 supported by the upper arm 1800.

Other Embodiments

Figure 17:
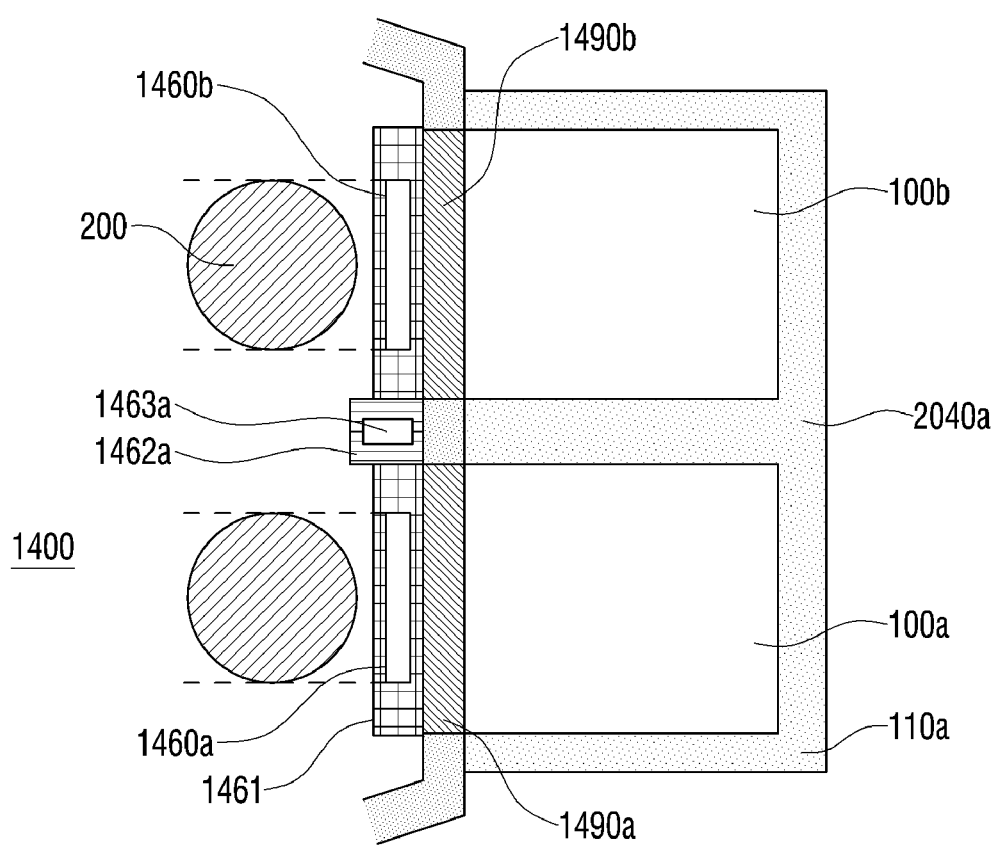
FIG. 17 schematically illustrates the configuration of a processing module in a vacuum transfer chamber of the substrate processing system according to the other embodiments.

Other embodiments are shown in FIG. 16 and FIG. 17. As shown in FIG. 16 and FIG. 17, the second gas supply unit 1462a is installed between the gas supply ports 1460a and 1460b of the first gas supply unit 1500. The second gas supply unit 1462a can inhibit gas from moving (diffusing) between the chamber 100a and the chamber 100b.

Preferably, the gas may be further suppressed from moving between the chamber 100a and the chamber 100b by the gas supply port 1463a of the second gas supply unit 1462a protruding more toward the center of the transfer chamber 1400 than the first gas supply port 1460 of the first gas supply unit 1500.

More preferably, the flow rates of the inert gas are adjusted such that the flow rate of the inert gas supplied through the gas supply port 1463a is greater than the flow rate of the inert gas supplied through the gas supply port 1460a, and the flow rate of the inert gas supplied through the gas supply port 1460a is equal to or greater than the flow rate of the inert gas supplied through the gas supply port 1460b. When the two end effectors are provided at different heights, the flow rates of the inert gas are adjusted such that the flow rate of the inert gas supplied through the gas supply port 1463a is greater than the flow rate of the inert gas supplied through the gas supply port 1460b, and the flow rate of the inert gas supplied through the supply port 1460b is greater than the flow rate of the inert gas supplied through the gas supply port 1460a. This configuration suppresses the gas from moving between the chamber 100a and the chamber 100b or moving from the chamber 100 to the transfer chamber 1400.

The second gas supply unit 1462a may include a gas guide (not shown) instead of the gas supply port 1463a.

The above embodiments have been described on a basis that the substrate is transported between the vacuum transfer chamber 1400 and the transfer chamber 203. However, the substrate may be transported between the loadlock chamber 1300 and the vacuum transfer chamber 1400, or between the loadlock chamber 1300 and the atmospheric transfer chamber 1200. The above-described technique may also be applied when a substrate is transported between the loadlock chamber 1300 and the vacuum transfer chamber 1400 or between the loadlock chamber 1300 and the atmospheric transfer chamber 1200. The techniques described above may also be applied to a substrate processing system configured to transport substrates directly from the atmospheric transfer chamber 1200 to the transfer chamber 203 without the vacuum transfer chamber 1400 or the loadlock chamber 1300. Even when the above-described technique is applied to the substrate processing system configured to transport the substrate directly from the atmospheric transfer chamber 1200 to the transfer chamber 203 without the vacuum transfer chamber 1400 or the loadlock chamber 1300, the above-described advantageous effects may be obtained. As described above, the diffusion of the inner atmosphere of chambers or particles may be suppressed by transporting the substrate under a vacuum atmosphere.

While the above-described technique has been described based on the film-forming method wherein a source gas and a reactive gas are alternately supplied, the above-described technique is not limited thereto. The above-described technique may be applied to other film-forming methods as long as the amount of gaseous reaction or by-products of the source gas and the reactive gas is within the allowable range. For example, the above-described technique may be applied to a film-forming method wherein the time period of supplying the source gas and the time period of supplying the reactive gas overlap.

While the above-described technique has been described based on the film forming process, the above-described technique is not limited thereto. The described technique may be applied to other processes. The above-described technique may be applied to processes such as diffusion process, oxidation process, nitridation process, oxynitridation process, reduction process, oxidation/reduction process, etching process and heating process. The above-described technique may also be applied to a process wherein a film formed on a substrate surface or substrate using only a reactive gas is subjected to a plasma oxidation process or a plasma nitridation process. The above-described technique may be applied to plasma annealing process using only reactive gas.

While the above-described technique has been described based on the manufacturing process of the semiconductor device, the above-described technique is not limited thereto. The above-described technique may be applied to processes other than the manufacturing process of a semiconductor device. The above-described technique may be applied to substrate processing such as liquid crystal device manufacturing process, solar cell manufacturing process, light emitting device manufacturing process, glass substrate processing, ceramic substrate processing and conductive substrate processing.

While the above-described technique has been described based on an example wherein a silicon nitride film is formed using the silicon-containing gas as a source gas and a nitrogen-containing gas as a reactive gas, the above-described technique is not limited thereto. The above-described technique may be applied to forming a film using other gases. The above-described technique may also be applied, for example, to forming oxygen-containing films, nitrogen-containing films, carbon-containing films, boron-containing films, metal-containing films and combinations thereof. Specifically, the above-described technique may be applied to formations of films such as SiN film, AlO film, ZrO film, HfO film, HfAlO film, ZrAlO film, SiC film, SiCN film, SiBN film, TiN film, TiC film and TiAlC film.

One or more chambers may be provided in the processing module. When a plurality of chambers are provided in the processing module, the heat capacity of the processing module increases. This affects the maintenance and the management of the processing module.

While the above-described technique has been described based on the apparatus that processes one substrate in one processing chamber, the above-described technique is not limited thereto. For example, the above-described technique may be applied to an apparatus for processing a plurality of substrates arranged in a horizontal direction or a vertical direction.

According to the technique described herein, the quality of substrate processing can be improved.

What is claimed is:

1. A substrate processing apparatus comprising:
   at least two chambers where a substrate is processed;
   a vacuum transfer chamber wherein the substrate is transferred;
   at least two gas valves comprising a first gate valve and a second gate valve; said at least two gate valves disposed between the vacuum transfer chamber and the at least two chambers,
   wherein the first gate valve is disposed between the vacuum transfer chamber and a first chamber and the second gate valve is disposed between the vacuum transfer chamber and a second chamber;
   a plurality of first gas supply units disposed at the vacuum transfer chamber and configured to supply an inert gas to the substrate when the substrate passes through one or more of the at least two gate valves, the plurality of first gas supply units comprising a first gas supply port, an opening of the first gas supply port extending parallel to a portion of the first gate valve extending from a sidewall to a partition wall between the first and second chamber and a second gas supply port, an opening of the second gas supply port extending parallel to a portion of the second gate valve extending from a sidewall to the partition wall between the first and second chamber;
   a transfer robot disposed in the vacuum transfer chamber and configured to transfer the substrate to the at least two gate valves; and a first gas guide installed between the first gas supply port and the second gas supply port, wherein the first gas guide protrudes closer toward the transfer robot than the first gas supply port or the second gas supply port extend toward the transfer robot.

2. The substrate processing apparatus of claim 1, further comprising a control unit configured to control the plurality of first gas supply units and the transfer robot to: supply the inert gas to the substrate at a first flow rate when a distance between a gas supply port of the plurality of first gas supply units and the substrate passing through the at least two gate valves is equal to a first distance; and supply the inert gas to the substrate at a second flow rate greater than the first flow rate when the distance between the gas supply port and the substrate passing through the at least two gate valves is equal to a second distance greater than the first distance.

3. The substrate processing apparatus of claim 1, further comprising a control unit, wherein the transfer robot comprises end effectors configured to support at least two substrates at different heights, and the control unit is configured to control the plurality of first gas supply units to supply the inert gas to the at least two substrates supported by the end effectors at different flow rates.

4. The substrate processing apparatus of claim 1, further comprising:
   a second gas supply unit disposed between the plurality of first gas supply units and configured to supply the inert gas, wherein the at least two processing chambers are adjacent to one another; and
   a control unit configured to control the plurality of first gas supply units and the second gas supply unit to: adjust a flow rate of the inert gas supplied by the second gas supply unit to be higher than a flow rate of the inert gas supplied by the plurality of first gas supply units.

5. The substrate processing apparatus of claim 2, further comprising a second gas supply unit disposed between the plurality of first gas supply units and configured to supply the inert gas, wherein the at least two processing chambers are adjacent to one another, and the control unit is further configured to control the plurality of first gas supply units and the second gas supply unit to: adjust a flow rate of the inert gas supplied by the second gas supply unit to be higher than a flow rate of the inert gas supplied by the plurality of first gas supply units.

6. The substrate processing apparatus of claim 1, wherein the transfer robot comprises two arms configured to transfer two substrates at different heights.

7. The substrate processing apparatus of claim 1, wherein a lower end of a gas supply port of the plurality of first gas supply units is at a same height as an upper end of an opening of one or more of the at least two gate valves.

8. The substrate processing apparatus of claim 2, wherein a lower end of the gas supply port is at a same height as an upper end of an opening of one or more of the at least two gate valves.

9. The substrate processing apparatus of claim 3, wherein a lower end of a gas supply port of the plurality of first gas supply units is at a same height as an upper end of an opening of one or more of the at least two gate valves.

10. The substrate processing apparatus of claim 4, wherein a lower end of a gas supply port of the plurality of first gas supply units is at a same height as an upper end of an opening of one or more of the at least two gate valves.

11. The substrate processing apparatus of claim 5, wherein a lower end of a gas supply port of the plurality of first gas supply units is at a same height as an upper end of an opening of one or more of the at least two gate valves.

12. The substrate processing apparatus of claim 1, further comprising a second gas guide disposed in the vacuum transfer chamber to face the plurality of first gas supply units, wherein the second gas guide is located at a same height as a lower end of an opening of one or more of the at least two gate valves.

13. The substrate processing apparatus of claim 2, further comprising a second gas guide disposed in the vacuum transfer chamber to face the plurality of first gas supply units, wherein the second gas guide is located at a same height as a lower end of an opening of one or more of the at least two gate valves.

14. The substrate processing apparatus of claim 3, further comprising a second gas guide disposed in the vacuum transfer chamber to face the plurality of first gas supply units, wherein the second gas guide is located at a same height as a lower end of an opening of one or more of the at least two gate valves.

15. The substrate processing apparatus of claim 4, further comprising a second gas guide disposed in the vacuum transfer chamber to face the plurality of first gas supply units, wherein the second gas guide is located at a same height as a lower end of an opening of one or more of the at least two gate valves.

* * * * *